United States Patent
Ohtorii

(10) Patent No.: US 8,324,029 B2
(45) Date of Patent: Dec. 4, 2012

(54) METHOD OF TRANSFERRING ELEMENTS, ELEMENT DISPOSITION SUBSTRATE, DEVICE AND METHOD OF MANUFACTURING THE SAME

(75) Inventor: Hiizu Ohtorii, Kanagawa (JP)

(73) Assignee: Sony Corporation, Tokyo (JP)

( * ) Notice: Subject to any disclaimer, the term of this patent is extended or adjusted under 35 U.S.C. 154(b) by 415 days.

(21) Appl. No.: 12/632,385

(22) Filed: Dec. 7, 2009

(65) Prior Publication Data

US 2010/0147358 A1 Jun. 17, 2010

(30) Foreign Application Priority Data

Dec. 11, 2008 (JP) ................................. 2008-315382

(51) Int. Cl.
*H01L 21/58* (2006.01)
(52) U.S. Cl. .............................. 438/118; 438/66; 438/73
(58) Field of Classification Search .................. 438/57, 438/64, 65, 67, 68, 110, 458
See application file for complete search history.

(56) References Cited

U.S. PATENT DOCUMENTS

| | | | | |
|---|---|---|---|---|
| 6,613,610 B2* | 9/2003 | Iwafuchi et al. | ............... | 438/128 |
| 6,656,819 B1* | 12/2003 | Sugino et al. | ................. | 438/460 |
| 6,872,635 B2* | 3/2005 | Hayashi et al. | ............... | 438/463 |
| 6,881,599 B2* | 4/2005 | Oohata | ...................... | 438/22 |
| 6,887,650 B2* | 5/2005 | Shimoda et al. | ............... | 430/311 |
| 6,939,729 B2* | 9/2005 | Iwafuchi et al. | ................ | 438/22 |
| 7,585,703 B2* | 9/2009 | Matsumura et al. | ........... | 438/128 |
| 7,763,139 B2* | 7/2010 | Hayashi et al. | ................ | 156/249 |
| 8,034,659 B2* | 10/2011 | Nagai et al. | .................... | 438/108 |
| 2002/0096994 A1* | 7/2002 | Iwafuchi et al. | ............... | 313/495 |
| 2002/0115265 A1* | 8/2002 | Iwafuchi et al. | ............... | 438/458 |
| 2002/0171089 A1* | 11/2002 | Okuyama et al. | ............... | 257/88 |
| 2003/0011377 A1* | 1/2003 | Oohata et al. | .................. | 324/512 |
| 2003/0034120 A1* | 2/2003 | Yanagisawa et al. | .......... | 156/238 |
| 2003/0087476 A1* | 5/2003 | Oohata et al. | .................. | 438/108 |

(Continued)

FOREIGN PATENT DOCUMENTS

JP 11-307878 11/1999

(Continued)

OTHER PUBLICATIONS

Japanese Patent Office Action corresponding to Japanese Serial No. 2008-315382 dated Sep. 28, 2010.

*Primary Examiner* — David Vu
*Assistant Examiner* — Earl Taylor
(74) *Attorney, Agent, or Firm* — SNR Denton US LLP

(57) ABSTRACT

Disclosed herein is a method of transferring elements, including the steps of: holding a plurality of elements made at a first pitch on an element formation substrate on a temporary holding substrate in a state; forming a plurality of element mounting bases and obtaining an element disposition substrate; disposing an uncured adhesive agent layer on each of the bearing surfaces of the element mounting bases; making the temporary holding substrate and the element disposition substrate close to each other and causing some of the plurality of elements to come in contact with the uncured adhesive agent layer; curing the uncured adhesive agent layer, fixing the elements contacting the adhesive agent layer to the element mounting bases; and separating the temporary holding substrate and the element disposition substrate from each other with the elements contacting the adhesive agent layer being left on the respective element mounting bases.

12 Claims, 12 Drawing Sheets

U.S. PATENT DOCUMENTS

| | | | |
|---|---|---|---|
| 2003/0160258 A1* | 8/2003 | Oohata | 257/99 |
| 2003/0170971 A1* | 9/2003 | Tomoda et al. | 438/602 |
| 2004/0209442 A1* | 10/2004 | Takakuwa et al. | 438/458 |
| 2005/0106839 A1* | 5/2005 | Shimoda et al. | 438/458 |
| 2005/0158896 A1* | 7/2005 | Hayashi et al. | 438/26 |
| 2005/0158904 A1* | 7/2005 | Hayashi et al. | 438/34 |
| 2010/0147358 A1* | 6/2010 | Ohtorii | 136/244 |

FOREIGN PATENT DOCUMENTS

| | | |
|---|---|---|
| JP | 2002-198569 | 7/2002 |
| JP | 2003-307751 | 10/2003 |
| JP | 2005-181610 | 7/2005 |
| JP | 2006-196712 | 7/2006 |
| JP | 2006-237428 | 9/2006 |
| JP | 2006-258835 | 9/2006 |
| JP | 2008-235349 | 10/2008 |

* cited by examiner

FOR EXAMPLE, PHOTOELECTRIC ELEMENTS EACH INDICATED BY BLACK CIRCLE ARE COLLECTIVELY TRANSFERRED ON RESPECTIVE BASES OF ELEMENT DISPOSITION SUBSTRATE BY ONE TRANSFER

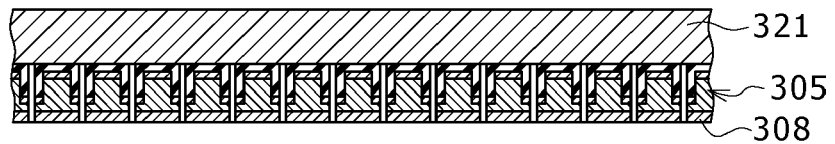
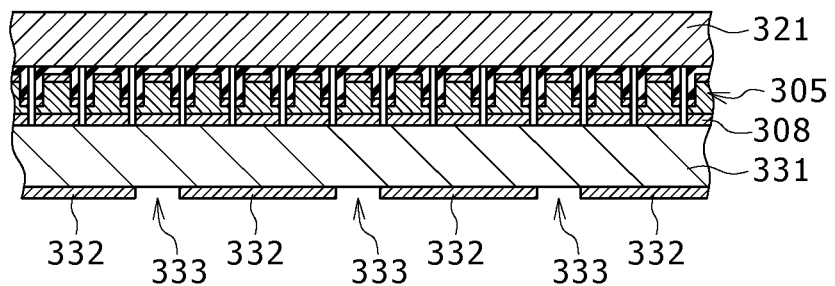
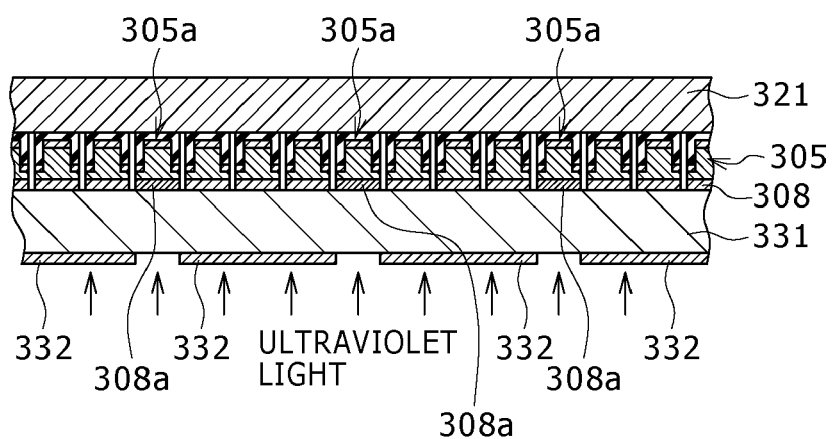
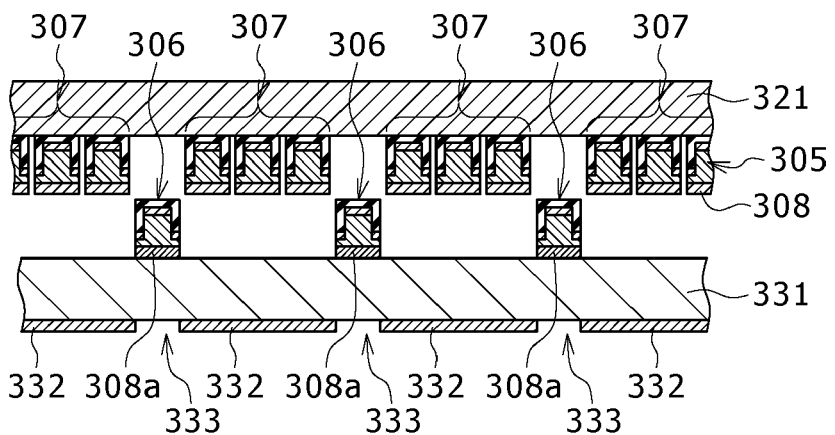

METHOD OF TRANSFERRING ELEMENTS, ELEMENT DISPOSITION SUBSTRATE, DEVICE AND METHOD OF MANUFACTURING THE SAME

BACKGROUND OF THE INVENTION

1. Field of the Invention

The present invention relates to a method of transferring elements from an element formation substrate on which a plurality of elements such as electrical elements or optical elements to an element disposition substrate at different pitches, the element disposition substrate with which the method of transferring elements is implemented, a device which is manufactured by applying the method of transferring elements, and a method of manufacturing the same.

2. Description of the Related Art

Heretofore, all of signal transfer between semiconductor chips each typified by a Large Scale Integrated Circuit (LSI) has been carried out by using electrical signals through substrate wirings. However, a communication amount of data required between the semiconductor chips has remarkably increased along with the recent high performance promotion for Microprocessor Units (MPUs), and thus the speeding up of the signals, and the densifying of the signal wirings have been required. As a result, the various high-frequency problems have arisen. A delay of the signal caused by the resistance and capacitance of the wiring, mismatching between the impedances, an Electro-Magnetic Compatibility/Interference (EMC/EMI) such as generation of a noise or a cross-talk, or the like is given as typical one of those problems. Here, the EMC/EMI means the compatibility, for the electro-magnetic environment, which prevents an electronic apparatus from giving or receiving an electromagnetic wave interference.

In order to solve those problems, the optimization of the wiring disposition, the development of the new materials, and the like have been carried out. However, for the purpose of realizing the further high function promotion, there has arisen the necessity for reviewing the mounting construction itself based on the simple mounting of the semiconductor chips. In order to cope with this situation, micro-wiring connection due to Multi-Chip Module (MCM) promotion, or the like has been proposed. In this multi-chip module, highly-functional chips are mounted to a precise mounting substrate such as a ceramic substrate or a silicon substrate, and thus the micro-wiring connection which can not be obtained in the existing multilayer printed wiring board is realized. As a result, the pitch narrowing of the wiring becomes possible, and the communication amount of data can be increased by widening a bus width.

In addition, an optical transmission coupling technique (optical interconnection) based on an optical wiring attracts attention as a technique for basically realizing the speeding up and capacity increasing of the signal communication. This technique, for example, is described in non-patent literary document of "Optical Wiring Encounter," NIKKEI ELECTRONICS, Dec. 3, 2001, pp. 122 to 125, FIGS. 4 to 7, and Yasuhiro Andoh, "Tendency of Optical Interconnection Technology and Next-Generation Device Mounting Technology," NTT R&D, Vol. 48, No. 3, pp. 271 to 280 (1999). With this technique, an electrical signal is converted into an optical signal, thereby largely increasing a transmission speed itself between chips. In addition, the optical signal does not require the measures to cope with the electromagnetic noise and the cross-talk at all, and thus a relatively flexible wiring design becomes possible.

The optical wiring can be applied between the electronic apparatuses, between the boards within the electronic apparatuses, between the chips within the board, and the like, and thus can be applied to various kinds of portions. For example, in the case of short-distance transmission of a signal, for example, between chips, as shown in FIG. 4, an optical waveguide 101 is formed on a printed wiring board 100 having chips mounted thereto. Also, an emitted light (for example, a laser beam), obtained through signal modulation, from a light emitting element (for example, a vertical cavity surface emitting laser) 104 is taken in from an inlet side end portion 102 of the optical waveguide 101 to be guided to an outlet side end portion 103 through the optical waveguide 101. Also, the emitted light thus guided is made incident to a light receiving element (for example, a photodiode) 105 through the outlet side end portion 103. An optical transmission/communication system in which the optical waveguide 101 is used as the transmission path for the laser beam obtained through the signal modulation can be constructed in the manner as described above.

A section for carrying out alignment among optical components (such as a light emitting element, a light receiving element, an optical waveguide, an optical fiber, and a lens), and connecting thereto optical paths, thereby carrying out position-fixing is essential for an optical wiring system. In this connection, the relatively positional precision between the optical components has to be satisfactorily held so that a connection loss of a light transmitted between the optical components falls within a tolerance. Hereinafter, in this specification, when no distinction is made between the light emitting element and the light receiving element, the light emitting element and the light receiving element will be referred to as "the photoelectric elements" in some cases. In addition, a process for carrying out alignment among the optical components, and connecting thereto the optical paths, thereby carrying out the position-fixing will be expressed hereinafter as the wording "the optical coupling is formed among the optical components."

Hereinafter, an active alignment method of carrying out alignment while an intensity of a signal light is actually observed, a method of carrying out alignment while an alignment marker formed on a substrate or the like is observed by using a microscope or the like is known as an alignment method. However, a lot of trouble is taken with such an alignment method, and thus is one of the causes by which the optical wiring system is made expensive. Therefore, there is desired a method of carrying out alignment with excellent productivity and at a low cost in accordance with a self-alignment method, based on an outer shape, such as fitting (mating) or abutment.

In addition, some sort of positional reference may be required for carrying out the alignment. For example, in the case of the surface mounting system previously described with reference to FIG. 4, the mounting board such as the printed wiring board 100 is used as the positional reference. However, for the purpose of realizing a desired positional precision with the mounting board as the positional reference, highly precision increasing may be required for the mounting board itself, which causes high costs. In addition, even when the mounting board which is not essentially designed in order to meet such a purpose is desired to be used as the positional reference, the possibility that a predetermined performance may not be realized owing to thermal expansion or the like is high.

In order to cope with such a situation, the inventor of the present invention earnestly carried out the study repeatedly, and as a result, proposed a technique that a socket is used instead of using a mounting board, an optical information processor having an optical waveguide array built between a set of sockets is formed, thereby constructing an optical wiring system. This technique is described in Japanese Patent Laid-Open No. 2005-181610 (refer to pages 8, 10 and 11, and FIGS. 1, 5 and 17) referred to as Patent Document 1 hereinafter. This socket is formed in such a way that a socket in an IC package such as a Pin Grid Array (PGA) package or a Land Grid Array (LGA) package is used as a base, and four recess portions serving as an optical waveguide array installing portion are provided in the shape of a cross. Also, this socket has a positioning section for positioning the optical waveguide array.

FIG. 5A is a schematic perspective view when a socket 110 is viewed from a side of a surface on which an optical waveguide is installed, and FIG. 5B is a schematic perspective view when the socket 110 is viewed from the side opposite to the side of the surface on which the optical waveguide is installed. In the socket 110, each of a recess portion 112 and a protrusion portion 113 for positioning and fixing an optical waveguide array (not shown) is provided in four portions. The optical waveguide array is fitted to one recess portion 112 to carry out the positioning thereof in a width direction, and is also made to abut against the protrusion portions 113 to carry out the positioning thereof in a length direction. It is noted that a depth of the recess portion 112 is larger than a thickness of the optical waveguide array 111. Each of convex surfaces 114 of the socket 110 is provided with a conduction section for making conduction between a front surface and a back surface of the socket 110, for example, recess portions 115 of terminal pins.

FIG. 6A is a schematic cross sectional view showing a state in which constituent elements of an optical information processor using the socket 110 shown in FIGS. 5A and 5B is exploded, and FIG. 6B is a schematic cross sectional view showing a state in which the constituent elements are assembled into the optical information processor using the socket 110 shown in FIGS. 5A and 5B. This optical information processor is composed of a set of sockets 110-1 and 110-2 fixed onto a printed wiring board 130, an optical waveguide array 111 built between these sockets 110-1 and 110-2, and interposers 120-1 and 120-2.

As shown in FIG. 6A, semiconductor integrated circuit chips 124 and 125 are mounted on upper surface sides of the interposers 120-1 and 120-2, respectively. Also, light emitting element arrays 122 for emitting lights to the optical waveguide array 111, and/or light receiving element arrays 123 for receiving an incident light emitted from the optical waveguide array 111 are flip chip-mounted on lower surface sides of the interposer 120-1 and 120-2. Also, rewiring electrodes 121 are provided in peripheral portions of the interposer 120-1 and 120-2.

In fixing the interposers 120-1 and 120-2 to the sockets 110-1 and 110-2, respectively, as shown in FIG. 10B, the rewiring electrodes 121 are inserted into the recess portions 115 of the terminal pins of the sockets 110-1 and 110-2, respectively, thereby causing lower surfaces of the rewiring electrodes 111 to come in contact with the convex surfaces 114 of the sockets 110-1 and 110-2, respectively. As a result, the interposers 120-1 and 120-2 are positioned in the sockets 100-1 and 100-2, respectively, by the fitting of the rewiring electrodes 121 to the recess portions 115 of the terminal pins, and the abutment of the lower surfaces of the interposers 120-1 and 120-2 against the convex surfaces 114 of the sockets 100-1 and 100-2.

As with this prior example, the optical waveguide array 111, and the light emitting elements 122 and/or the light receiving elements 123 are aligned with each other through the sockets 100-1 and 100-2, and the interposers 120-1 and 120-2. For this reason, the precision of the optical coupling between the optical waveguide array 111, and the light emitting elements 122 and/or the light receiving elements 123 depends only on the manufacture precision of the sockets 100-1 and 100-2, and the interposers 120-1 and 120-2, and thus is independent of the manufacture precision of the mounting board such as the printed wiring board 130.

Moreover, the inventor of the present invention proposed a photoelectric converter which has a positioning section not depending on the manufacture precisions of the sockets and the interposers, and in which highly precise optical coupling can be formed at a low cost. This photoelectric converter is described in Japanese Patent Laid-Open No. 2006-258835 (refer to pages 8 and 9, and FIG. 1) referred to as Patent Document 2 hereinafter. FIG. 7A is a top plan view of a lower surface side (a light emission or light incidence side) of the photoelectric converter 210, FIG. 7B is a cross sectional view of the photoelectric converter 210 taken on line 7B-7B of FIG. 11A, and FIG. 7C is a cross sectional view of an optical waveguide module using the photoelectric converter 210 taken on line 7B-7B of FIG. 7A. In addition, dotted lines in FIGS. 7B and 7C indicate important members located in positions which are out of the cross sectional positions, respectively (and so forth on).

As shown in FIGS. 7A and 7B, in the photoelectric converter 210, a plurality of photoelectric elements 205 are disposed in an element mounting substrate 211. Although the three photoelectric elements 205 are shown in FIGS. 7B and 7C for the sake of convenience of illustration, the number of photoelectric elements 205 is especially by no means limited.

The photoelectric element 205 is either a light emitting element such as a Vertical Cavity Surface Emitting Laser (VCSEL), or a light receiving element such as a photodiode. The photoelectric element 205 is flip chip-connected in its electrode 206 formed on its upper surface to an interposer (not shown) or the like through a solder bump or the like to be electrically connected to a controlling semiconductor chip (not shown) or the like mounted to the interposer or the like. The semiconductor chip, for example, is a wafer-level Chip Scale Package (CSP).

A lower surface of the photoelectric element 205 is formed as either a light emission surface or a light incidence surface, and also an electrode is formed so as not to impede on optical path. A base glass 212 for strength reinforcement is joined to the optically-transparent electrode, and a glass substrate 213 is joined to the base glass 212 for strength reinforcement. The base glass 212 for strength reinforcement serves to hold the mechanical strength, and thus may be omitted (refer to Japanese Patent Laid-Open No. 2006-237428). Lens portions 214 are provided on the glass substrate 213. The lens portion 214 serves to collimate an emitted light, thereby preventing the emitted light from diffusing when the photoelectric element 205 is formed as the light emitting element. On the other hand, the lens portion 214 serves to condense an incident light on the light receiving element when the photoelectric element 205 is formed as the light receiving element.

As shown in FIG. 7C, the photoelectric converter 210 and an optical waveguide array 220 are combined with each other, thereby forming the optical waveguide module 230. In this case, the optical waveguide array 220 either guides a light emitted from the photoelectric converter 210 to the outside, or guides an incident light from the outside to the photoelectric converter 210. The optical waveguide module 230 is a unit module of an optical information processor which can be constructed by combining the two optical waveguide modules 230, that is, the optical waveguide module 230 on a side of transmission of an optical signal, and the optical waveguide module 230 on a side of reception of an optical signal with each other.

Each of optical waveguides of the optical waveguide array 220 is composed of a core 221 as a waveguide path, an upper cladding 222, and a lower cladding 223. An end surface of the core 221 is formed as a reflecting surface 224, having an inclination angle of 45°, for incidence/emission of a light to/from the photoelectric element 205. The upper cladding 222 in the vicinity of the end surface 224 is provided with a lens portion 225. When the photoelectric element 205 is formed as the light emitting element, the lens portion 225 serves to condense the emitted light from the light emitting element on the reflecting surface 224 having the inclination angle of 45° to guide the emitted light to the inside of the core 221. On the other hand, when the photoelectric element 205 is formed as the light receiving element, the lens portion 225 serves to collimate an incident light made incident from the outside to the core 221 to be propagated through the inside of the core 221 to be reflected by the reflecting surface 224 having the inclination angle of 45°. Thus, the lens portion 225 serves to prevent the incident light from diffusing, thereby sending the incident light to the photoelectric element 205.

The glass substrate 213 is provided with convex portions (pins) 231 each serving as a positioning section, and the upper cladding 222 of the optical waveguide array 220 is provided with recess portions 232 to which the convex portions (pins) 23 are intended to be fitted, respectively. The photoelectric element 205 of the photoelectric converter 210, and the core 221 of the optical waveguide array 220 are aligned with each other by the fitting of the convex portions (pins) 231 to the recess portions 232 to be optically coupled to each other. At this time, it is better that the photoelectric element 205 and the reflecting surface 224 having the inclination angle of 45° face each other with their optical axes being made to agree with each other, and the centers of the lens portion 214 and the lens portion 225 are located on an optical axis connecting the photoelectric lens 205 with the reflecting surface 224 having the inclination angle of 45°. By adopting this construction, when the photoelectric element 205 is formed as the light emitting element, the emitted light from the light emitting element, for example, is collimated into a parallel beam by the lens portion 214 to be sent out. Also, the resulting parallel beam is condensed on the reflecting surface 224 having the inclination angle of 45° of the optical waveguide array 220 to be efficiently guided to the core 221 of the optical waveguide array 220. On the other hand, when the photoelectric element 205 is formed as the light receiving element, the incident light which is made incident from the outside to the core 221 to be propagated through the outside of the core 221, thereby being reflected by the reflecting surface 224 having the inclination angle of 45°, for example, is collimated into a parallel beam by the lens portion 225 to be sent to the photoelectric element 205 side. Also, the resulting parallel beam is efficiently condensed on the light receiving surface of the photoelectric element 205 by the lens portion 214.

Therefore, when the convex portions (pins) 231 each serving as the positioning section, the recess portions 232 to which the convex portions 231 are fitted, respectively, and the lens portions 214 and 225 are manufactured with predetermined precisions, respectively, the optical coupling between the photoelectric element 205 and the optical waveguide core 221 can be formed with a desired precision. In such a manner, since the members associated with the optical coupling are miniaturized, the precision of the optical coupling is enhanced, and the cost lowering becomes possible. In addition, even an expensive material such as a material having a low coefficient of thermal expansion or a material having excellent processing characteristics can be used as long as the material has the excellent material characteristics. As a result, the precision can be further enhanced.

Now, there are many examples in each of which when the semiconductor device is manufactured using the semiconductor chips as with the photoelectric converter described above, wirings or the like for the power source are formed and the desirable semiconductor device is manufactured after a large number of semiconductor chips collectively formed on the element formation substrate are partitioned into pieces and the resulting pieces are rearranged at a desired pitch on the element mounting substrate.

For example, an image display device using light emitting diodes (LEDs) as display elements is one of those examples. In this case, the element formation substrate is diced to be partitioned into the LED chips, forming the respective pixels, which are taken out in turn. Also, the resulting LED chips are individually connected to the external electrodes through either the wire bonding connection or the bump connection based on flip chip. Normally, the pitch of disposition of the LED chips in the image display device is much larger than that of the LED chips on the element formation substrate.

In general, in the element formation substrate, it is desirable that for the purpose of effectively utilizing the expensive substrate, and enhancing the productivity, a large number of elements are formed at a pitch nearly equal to a size of the element as tightly as possible. On the other hand, in the element mounting substrate, the pitch between each adjacent two elements is determined to be a size most suitable for the utilization desire of the chips. Essentially, those two pitches are independent of each other. Thus, when after the individual elements are obtained through the partitioning, the elements are disposed at the predetermined pitch on the element mounting substrate one by one as with the existing case, a difference between the two pitches does not matter.

However, as the number of semiconductor chips increases, such a disposition process is laborious and thus becomes the expensive process. In addition, as the size of the semiconductor chip becomes small, it becomes difficult to handle the semiconductor chip after completion of the partitioning. Even so, when a plurality of elements formed on the element formation substrate are desired to be collectively handled without carrying out the partitioning, it is necessary to form the semiconductor chips on the element formation substrate at the same pitch as that in the element mounting substrate. This is not allowed for the enhancement of the productivity as well as for the effective utilization of the expensive element formation substrate.

In order to cope with such a situation, a thinning-out transfer method is known as follows. That is to say, although a plurality of elements formed on an element formation substrate are partitioned into pieces, the plurality of elements are not perfectly dissected out, but are collectively held on a temporary holding substrate while a pitch in the element formation substrate in the phase of manufacture is held. After that, a group of elements on the temporary holding substrate is thinned out and selected so that a pitch between each adjacent two semiconductor chips becomes a predetermined pitch. Also, the elements thus selected are collectively transferred from the temporary holding substrate to an element disposition substrate.

FIGS. 8A to 8D are respectively cross sectional views showing a flow of the thinning-out transfer method described in Japanese Patent Laid-Open No. 2002-198569 (refer to pages 4 and 5, and FIGS. 1 and 2) referred to as Patent Document 3 hereinafter. Hereinafter, an essential point of the thinning-out transfer method will be described with reference to FIGS. 8A to 8D.

In this thinning-out transfer method, firstly, as shown in FIG. 8A, a plurality of elements 305 formed on an element formation substrate are collectively held on a temporary holding substrate 321. An adhesive agent layer (not shown) or the like is formed on a surface of the temporary holding substrate 321, and can hold the elements 305 with its adhesive force. Although the elements 305 are partitioned into pieces, a pitch between each adjacent two elements 305 is the same as that in the element formation substrate. Moreover, an ultraviolet curable resin 308 is disposed on a surface of each of the elements 305.

Next, as shown in FIG. 8B, the elements 305 held on the temporary holding substrate 321, and the element disposition substrate 331 are attached firmly to each other in a state in which the ultraviolet curable resin 308 is uncured. A mask layer 332 having opening portions in element mounting positions, respectively, is disposed on a back surface of the element disposition substrate 331

Next, as shown in FIG. 8C, an ultraviolet light is radiated from the back surface side of the element disposition substrate 331 through the opening portions 333 of the mask layer 332, thereby selectively curing the ultraviolet curable resin layer 308a stuck to the elements 305 located in the element mounting positions, respectively. As a result, the elements 305a are firmly fixed to the element disposition substrate 331.

Next, as shown in FIG. 8D, the temporary holding substrate 321 and the element disposition substrate 331 are quietly separated from each other. The elements 305a located in the respective element mounting positions and firmly fixed to the temporary holding substrate 331 are left on the element disposition substrate 331 to be selectively transferred from the temporary holding substrate 321 to the element disposition substrate 331 (elements 306). On the other hand, other elements 305 to which the ultraviolet curable resin layer 308 which does not receive the radiation of the ultraviolet light radiated thereto and thus is kept uncured is stuck are separated from the element disposition substrate 331 while being held on the temporary holding substrate 321 (elements 307). The elements 307 none of which is transferred to the element disposition substrate 331 wait for the transfer in a transfer process in and after next time.

Although in this embodiment, the case where the ultraviolet curable resin layer 308 is disposed on each of the surfaces of the elements 305 is shown, the same transfer can be carried out even when the ultraviolet curable resin layer 308 is disposed on the surfaces of the element disposition substrate 331.

SUMMARY OF THE INVENTION

As has been described, with the method in which a large number of elements collectively formed on the element formation substrate are partitioned into pieces, and are re-disposed at the desired pitch on the element mounting substrate, thereby manufacturing the desirable device, as the number of elements increases, the labor is consumed and the cost increases. In addition, as the size of each of the elements becomes small, it becomes difficult to handle the elements.

In order to cope with this situation, the thinning-out transfer method as shown in Patent Document 3 is known as follows. That is to say, although a plurality of elements formed on the element formation substrate are partitioned into pieces, the elements are selected from the element group 305 held on the temporary holding substrate 321 while the pitch in the element formation substrate is held so that the pitch between each adjacent two elements becomes the predetermined pitch. Also, the elements 306 thus selected are collectively transferred to be re-disposed on the element disposition substrate 331. However, with this method shown in FIGS. 8A to 8D, the ultraviolet curable resin layer 308 is disposed on each of the surfaces as well of the elements 307 none of which is transferred to the element disposition substrate 331 in the first round of the transfer process. It is feared that thereafter, the ultraviolet curable resin layer 308 passes around the region other than each of the surfaces of the elements 307. In this case, since an outer diameter of each of the elements 307 held on the temporary holding substrate 321 is as very small as about 10 to about 20 μm, the element 307 may be moved by a surface tension of the ultraviolet curable resin layer 308 thus passed therearound. In addition, when the next transfer process is not immediately carried out, the ultraviolet curable resin from which a solvent has vaporized consolidates into a gel state, which may become a cause for making a yield in the subsequent transfer process worse.

In order to prevent those inconveniences there is necessary a process for cleaning and removing the ultraviolet curable resin layer 308 stuck to each of elements 307 not transferred. However, this process consumes the labor and becomes a cause for reducing the productivity. In addition, the elements 307 are in a state of being temporary held on the temporary holding substrate 321 by the adhesive agent or the like. Thus, when the ultraviolet curable resin passed around a gap defined between each adjacent two elements 307 is desired to be perfectly removed by the ultrasonic cleaning or the spinner, the elements 307 may drop off from the temporary holding substrate 321.

In the case as well where the ultraviolet curable resin layer is disposed on the surface of the element disposition substrate 331, when the elements 305 held on the temporary holding substrate 321, and the element disposition substrate 331 are attached firmly to each other, the ultraviolet curable resin is also stuck to the elements 307 not transferred. As a result, the same problem as that of the foregoing is caused.

The present invention has been made in order to solve the problems as described above, and it is therefore desirable to provide a transfer method of transferring elements from an element formation substrate on which a plurality of elements such as electrical elements or optical elements are made to an element disposition substrate at different pitches, a yield of the transfer being prevented from becoming worse even when the transfer is repetitively carried out, an element disposition substrate with which the transfer method is implemented, and a device which is manufactured by application of the transfer method, and a method of manufacturing the same.

In order to attain the desire described above, according to an embodiment of the present invention, there is provided a method of transferring elements including the steps of: holding a plurality of elements made at a first pitch on an element formation substrate on a temporary holding substrate in a state in which the first pitch is held although the plurality of elements are partitioned into pieces; forming a plurality of element mounting bases each having a planar shape having a size smaller than the first pitch, and each having a bearing surface slightly higher than a surface of a main portion of an element disposition substrate in its periphery at a second pitch equal to an integral multiple of the first pitch on the surface of the main portion of the element disposition substrate, thereby obtaining an element disposition substrate; disposing an uncured adhesive agent layer on each of the bearing surfaces of the element mounting bases; making the temporary holding substrate and the element disposition substrate close to each other in a state in which principal surfaces of the temporary holding substrate and the element disposition substrate face each other, and causing some of the plurality of elements to come in contact with the uncured adhesive agent layer; curing the uncured adhesive agent layer, thereby fixing the elements contacting the adhesive agent layer to the element mounting bases, respectively; and separating the temporary holding substrate and the element disposition substrate from each other with the elements contacting the adhesive agent layer being left on the respective element mounting bases.

According to another embodiment of the present invention, there is provided an element disposition substrate including, when a plurality of elements are made at a first pitch on an element formation substrate: a substrate main portion; and a plurality of element mounting bases each having a planer shape having a size smaller than the first pitch, and each having a bearing surface slightly higher than a surface of the substrate main portion in its periphery formed at a second pitch equal to an integral multiple of the first pitch on the surface of the substrate main portion.

According to still another embodiment of the present invention, there is provided a method of manufacturing a device including the steps of: holding a plurality of elements made at a first pitch on an element formation substrate on a temporary holding substrate in a state in which the first pitch is held although the plurality of elements are partitioned into pieces; forming a plurality of element mounting bases each having a planar shape having a size smaller than the first pitch, and each having a bearing surface slightly higher than a surface of a main portion of an element disposition substrate in its periphery at a second pitch equal to an integral multiple of the first pitch on the surface of the main portion of the element disposition substrate, thereby obtaining an element disposition substrate; disposing an uncured adhesive agent layer on each of the bearing surfaces of the element mounting bases; making the temporary holding substrate and the element disposition substrate close to each other in a state in which principal surfaces of the temporary holding substrate and the element disposition substrate face each other, and causing some of the plurality of elements to come in contact with the uncured adhesive agent layer; curing the uncured adhesive agent layer, thereby fixing the elements contacting the adhesive agent layer to the element mounting bases, respectively; separating the temporary holding substrate and the element disposition substrate from each other with the elements contacting the adhesive agent layer being left on the respective element mounting bases; and cutting and partitioning the element disposition substrate into pieces each having a predetermined shape, and/or connecting a plurality sheets of element disposition substrates to one another, thereby forming a substrate having the elements each having the predetermined shape formed therein through assemble.

According to yet another embodiment of the present invention, there is provided a device, including: a mounting substrate into which an element disposition substrate composed of a substrate main portion and a plurality of element mounting bases when a plurality of elements are formed at a first pitch on an element formation substrate is assembled in a predetermined shape through cutting and partitioning, and/or connection of the plurality sheet of element disposition substrates, the plurality of element mounting bases each having a planar shape having a size smaller than the first pitch, and each having a bearing surface slightly higher than a surface of the substrate main portion in its periphery being formed at a second pitch equal to an integral multiple of the first pitch on a surface of the substrate main portion; and the plurality of elements fixed to the element mounting base, respectively, by an adhesive agent layer.

According to the method of transferring elements, a plurality of elements made at the first pitch on the element formation substrate are temporary held on the temporary holding substrate in the state in which the first pitch is held although the plurality of elements are partitioned into the pieces. As will be described with reference to FIGS. 3A to 3J in an embodiment which will be described later, the plurality of elements are temporary held on the temporary holding substrate, whereby the adjustment of the directions of the elements, the thinning of the element formation substrate, the partitioning of the elements into pieces, and the like can be smoothly carried out.

On the other hand, a plurality of element mounting bases each having the planar shape having the size smaller than the first pitch, and each having the bearing surface slightly higher than the surface of the main portion of the element disposition substrate in its periphery are formed at the second pitch equal to the integral multiple of the first pitch on the surface of the main portion of the element disposition substrate. Also, the uncured adhesive agent layer is disposed on each of the bearing surfaces of the element mounting bases.

The temporary holding substrate and the element disposition substrate which are prepared in the manner as described above are made close to each other in the state in which the principal surfaces of the temporary holding substrate and the element disposition substrate face each other. Also, some of the plurality of elements are caused to come in contact with the uncured adhesive agent layer. At this time, when a ratio of the second pitch to the first pitch is set as an integral number, n, only the elements each selected every (n−1) elements of the plurality of elements arranged on the temporary holding substrate can be caused to come in contact as the elements with the uncured adhesive agent layer on each of the element mounting bases.

After that, the uncured adhesive agent layer is cured at a suitable time point, thereby fixing the elements contacting the adhesive agent layer to the respective element mounting bases. In addition, the elements contacting the adhesive agent layer are left on the respective element mounting bases by either the fixing force of the cured adhesive agent layer or the adhesive force of the uncured adhesive agent layer. In this state, the temporary holding substrate and the element disposition substrate are separated from each other. In such a manner, the elements each selected every (n−1) elements of the plurality of elements arranged on the temporary holding substrate can be collectively transferred to the element disposition substrate.

Other elements left on the temporary holding substrate wait for the transfer in the transfer process in and after next time. In this connection, none of other elements comes in contact with the adhesive agent layer on the respective element mounting bases because the planar shape of each of the element mounting bases has the size smaller than the first pitch. In addition, since the base of each of the element mounting bases is slightly higher than the surface of the main portion of the element disposition substrate in its periphery, even when the adhesive agent layer is disposed on the surface of the substrate main portion in the periphery, any of other elements is prevented from coming in contact with the adhesive agent layer. Therefore, the adhesive agent is prevented from being stuck to any of other elements other than the elements transferred. Also, the yield in the subsequent transfer process is prevented from becoming worse due to the adhesive agent stuck in the preceding transfer process.

According to the method of manufacturing a device of the present invention, the manufacturing method includes the assemble step in addition to the method of transferring elements described above as follows. That is to say, the element disposition substrate is cut and separated into the elements each having the predetermined shape, and/or the plurality sheet of element disposition substrates are connected to one another, thereby forming the substrate having the predetermined shape, and having the elements mounted thereto. Therefore, it is possible to obtain the mounting substrate having the practical size, and having the elements mounted thereto. For example, when the optical elements are mounted to the mounting substrate, the resulting mounting substrate can be utilized as the device as it is. On the other hand, when the electrical elements such as the active elements or the passive elements are mounted to the mounting substrate, the electronic device can be obtained through addition of a step of forming wirings and electrodes.

It is noted that when a wafer having a diameter of 2 to 4 inches is used as either the element formation substrate or the element disposition substrate, an enormous number of elements are mounted to the element disposition substrate as well after completion of the thinning-out transfer. Therefore, the processes for these elements are not individually carried out, but it is better to batch-process these processes for all the elements by utilizing a wafer-level semiconductor technology. The element disposition substrate described above of the present invention is best suitable for the batch processing in such a wafer level, and thus the device described above can be manufactured with the excellent productivity. In addition, although the assemble step described above is normally a step of cutting the large element disposition substrate into small mounting substrates each having a small size, when an LED image display apparatus having a large screen is made, that assemble step becomes a step of connecting a plurality sheet of element disposition substrates to one another, thereby obtaining a large mounting substrate having a large size.

Since the element disposition substrate of the present invention includes the substrate main portion, and the element mounting bases described above, the method of transferring elements of the present invention can be implemented. In addition, the device of the present invention can be simply made with the excellent productivity because the elements are mounted onto the mounting substrate described above by utilizing the method of transferring elements described above.

BRIEF DESCRIPTION OF THE DRAWINGS

FIGS. 8A to 8D are respectively cross sectional views showing a flow of a thinning-out transfer method described in Patent Document 3.

DETAILED DESCRIPTION OF THE PREFERRED EMBODIMENTS

Figure 1A:
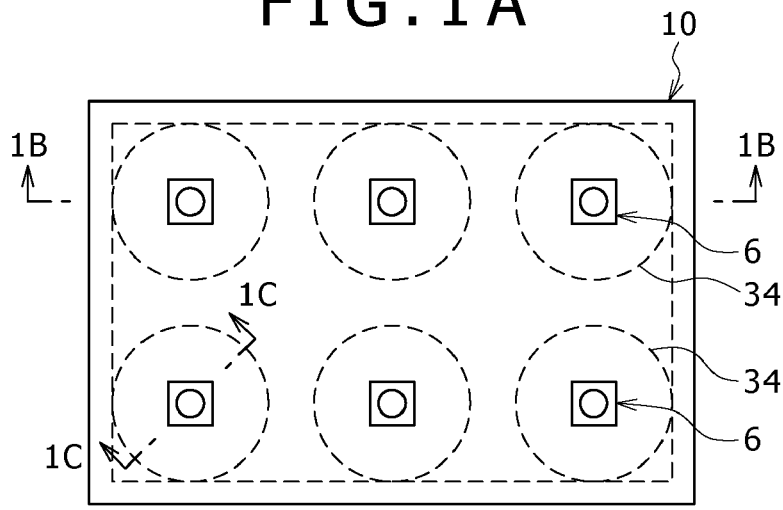
FIGS. 1A, 1B and 1C are respectively a top plan view showing a structure of a photoelectric converter according to an embodiment of the present invention, a cross sectional view taken on line 1B-1B of FIG. 1A, and a cross sectional view taken on line 1C-1C of FIG. 1A.

In the method of transferring elements of the present invention, it is better that the base having the same planar shape as that of each of the elements is formed as each of the element mounting bases.

In addition, it is better that the element mounting bases are formed by etching the surface of the element disposition substrate. Or, the element disposition substrate having the element bases is made in an injection molding process. Or, it is better that after the ultraviolet curable resin layer is formed on the surface of the element disposition substrate, the element mounting bases are formed by patterning the ultraviolet curable resin layer in a photolithography process, or after a resin layer is formed on the surface of the element disposition substrate, the element mounting bases are formed by patterning the resin layer in both the photolithography process and an etching process.

In addition, it is better that after completion of the process for curing the uncured adhesive layer, the process for separating the temporary holding substrate and the element disposition substrate from each other is carried out. Or, the process for curing the uncured adhesive agent layer may also be carried out after completion of the process for using a material having a low adhesive property as the material of the uncured adhesive agent layer, and separating the temporary holding substrate and the element disposition substrate from each other.

It is better that the process for using the ultraviolet curable resin as the material of the uncured adhesive agent layer, and curing the uncured adhesive agent layer is carried out by radiation of the ultraviolet light.

It is better that in the element disposition substrate of the present invention, the planar shape of each of the element mounting bases is identical to that of each of the elements.

It is better that each of the elements is a photoelectric element and/or an optical element, and the photoelectric element and/or the optical element has optical transparency for a light emitted from the element or a light made incident to the element.

In the method of manufacturing a device of the present invention, it is better that the base having the same planar shape as that of each of the elements is formed as each of the element mounting bases.

In addition, it is better that semiconductor elements are mounted as the elements, and wirings and/or electrodes for these semiconductor elements are collectively formed before the assemble process.

In the device of the present invention, it is better that the planar shape of each of the element mounting bases is identical to that of each of the elements.

In addition, it is better that semiconductor elements are mounted as the elements, and wirings and/or electrodes are provided for these semiconductor elements, thereby constructing the device of the present invention as an electronic device.

In this connection, it is better that the electronic device is constructed as a photoelectric converter in which the semiconductor element is a back surface type photoelectric element for emitting a light or making a light incident from or to a back surface side thereof, and each of the element mounting base and the mounting substrate has an optically-transparent property for the light emitted from the photoelectric element or the light made incident to the photoelectric element.

Moreover, it is better that a lens for controlling a path of a light emitted from the element, or a light made incident to the element is provided on a surface on a side opposite to a surface having the element mounted thereto so as to face the element.

Hereinafter, the preferred embodiments of the present invention will be described concretely in detail with reference to the accompanying drawings. In embodiments, a description will now be given with respect to a method of transferring elements, an element disposition substrate for implementing the method of transferring elements, a method of manufacturing a device, and a device manufactured by application of the method of transferring elements by giving a photoelectric converter as an example of the device.

Figure 1B:
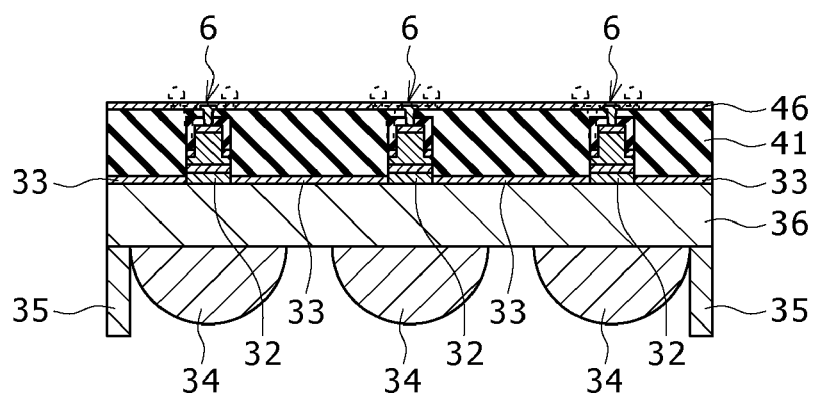
Figure 1C:
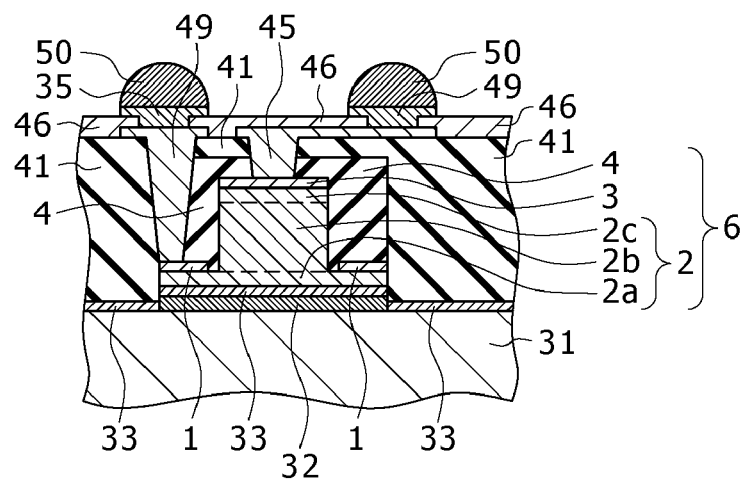

Firstly, the photoelectric converter as the device according to an embodiment of the present invention will be described hereinafter with reference to FIGS. 1A to 1C. FIG. 1A is a top plan view showing a structure of a photoelectric converter 10 according to an embodiment of the present invention. FIG. 1B is a cross sectional view taken on line 1B-1B of FIG. 1A. Also, FIG. 1C is a partially enlarged cross sectional view taken on line 1C-1C of FIG. 1A. In addition, dotted lines in FIG. 1B indicate important members located out of the cross sectional position.

Figure 7A:
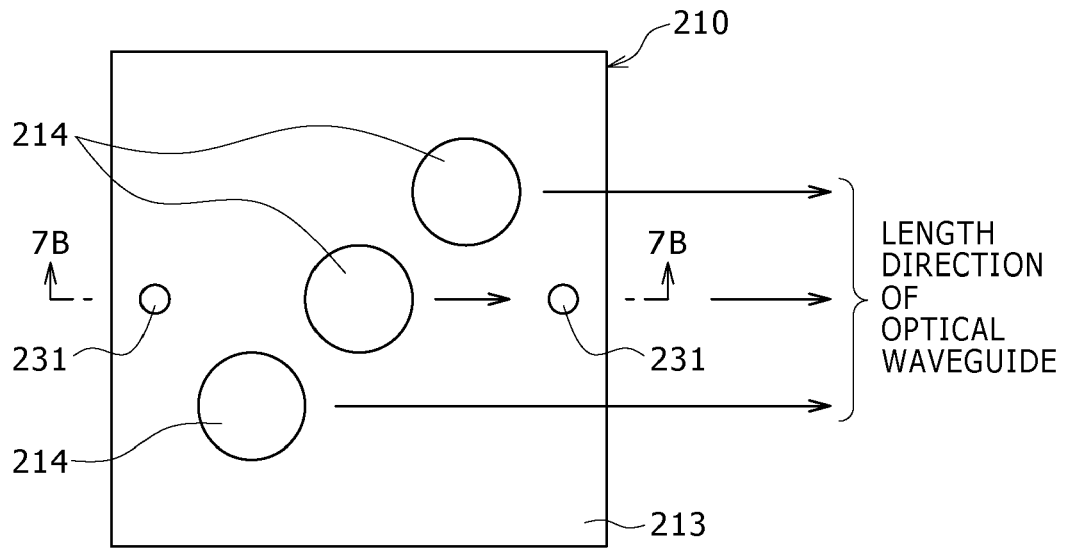
FIGS. 7A, 7B and 7C are respectively a top plan view of a lower surface side (a light emission or light incidence side) of a photoelectric converter proposed in Japanese Patent Laid-Open No. 2006-258835, a cross sectional view of the photoelectric converter taken on line 7B-7B of FIG. 7A, and a cross sectional view, of an optical waveguide module using the photoelectric converter shown in FIGS. 7A and 7B, taken on line 7B-7B of FIG. 7A.
Figure 7B:
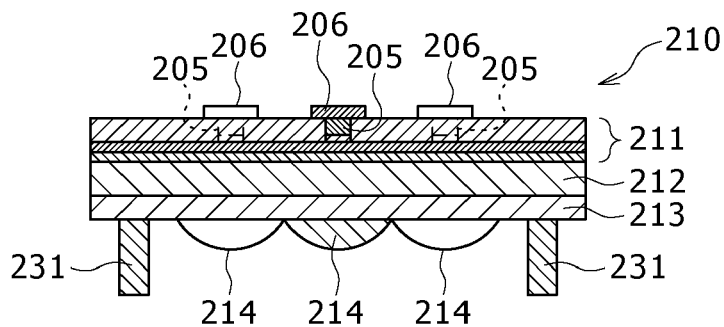
Figure 7C:
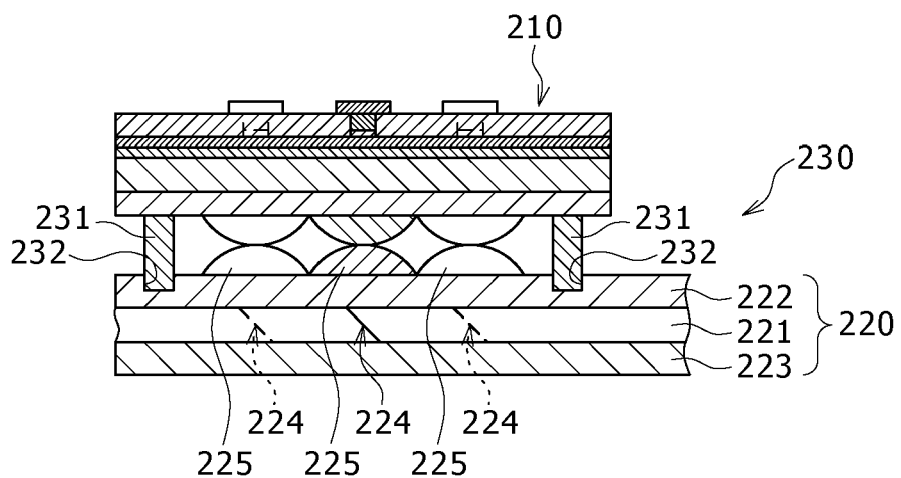

As shown in FIG. 1A, in the photoelectric converter 10, a plurality of photoelectric elements 6 as the elements described are disposed on a main portion 36 of an element mounting substrate. Although six photoelectric elements 6 are shown in FIG. 1A for the sake of convenience of illustration, the number of photoelectric elements 6 is especially by no means limited to six. The photoelectric converter 10 is combined with an optical waveguide array or the like to form an optical waveguide module similarly to the case of the photoelectric converter 210 shown in FIGS. 7A to 7C. The optical waveguide module is a unit module of an optical information processor which can be constructed by combining two optical waveguide modules, i.e., an optical waveguide module on a transmission side of an optical signal, and an optical waveguide module on a reception side of the optical signal with each other.

Figure 6A:
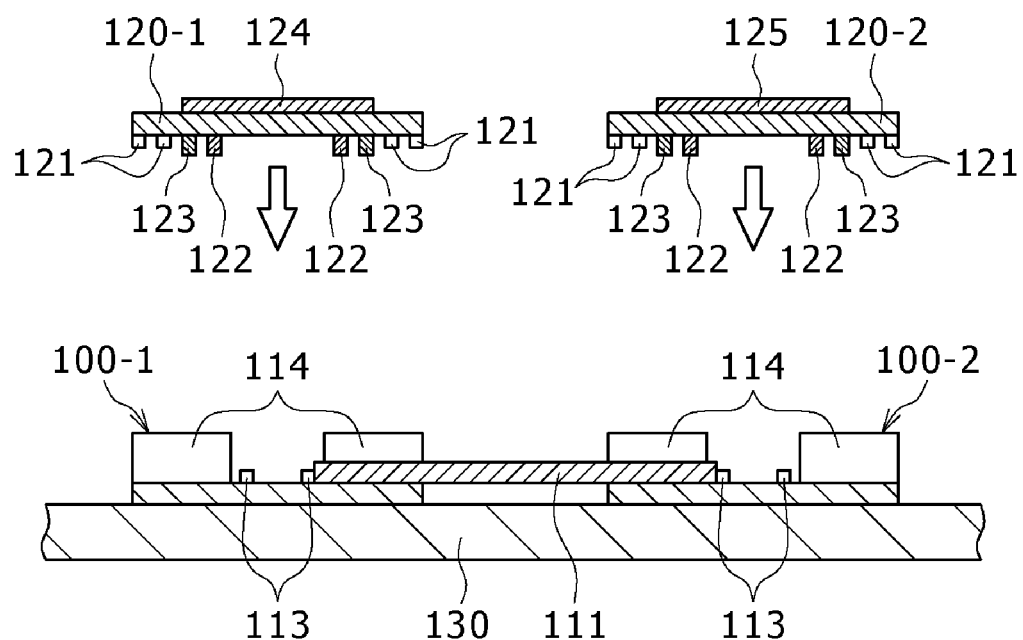
FIGS. 6A and 6B are respectively a schematic exploded perspective view showing an optical information processor using the socket shown in FIGS. 5A and 5B, and a schematic cross sectional view of the optical information processor shown in FIG. 6A in an assemble state.
Figure 6B:
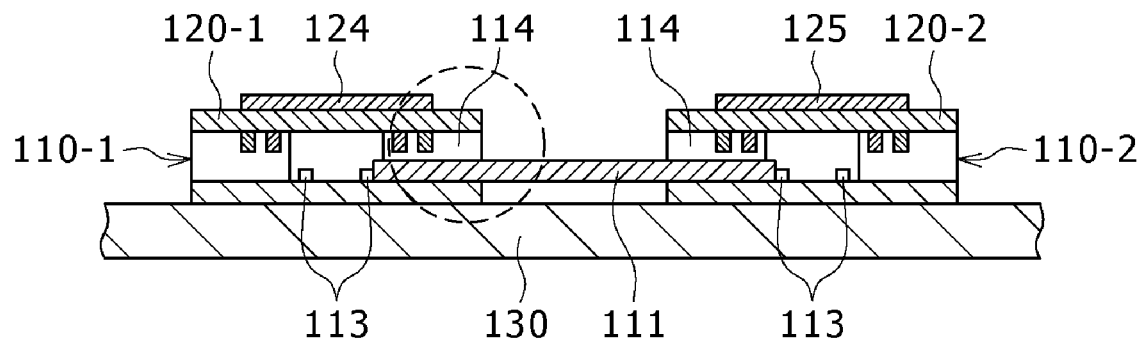

The photoelectric element 6 is either a light emitting element such as a Vertical Cavity Surface Emitting Laser (VCSEL), or a light receiving element such as a photodiode. When the photoelectric element 6 is the VCSEL, as shown in FIG. 1C, a semiconductor layer 2 of the photoelectric element 6 is composed of an n-type laser 2a such as an n-type gallium arsenic (GaAs) layer, a light emitting portion 2b, and a p-type layer 2c such as a p-type gallium arsenic (GaAs) layer. Also, an n-side electrode 1 and a p-side electrode 3 are provided so as to contact the n-type layer 2a and the p-type layer 2c, respectively. The photodiode element 6 is flip chip-connected to an interposer (not shown) or the like through a solder bump 50 or the like formed on an upper portion of the photoelectric element 6 to be electrically connected to a controlling semiconductor chip (not shown) or the like mounted to the interposer or the like. The semiconductor chip, for example, is a wafer-level Chip Scale Package (CSP) (refer to FIGS. 6A and 6B).

The light emitting portion 2, for example, has a double hetero structure. In the double hetero structure, a light emitting layer made of gallium arsenic (GaAs) is sandwiched between an n-type aluminum gallium arsenic (AlGaAs) cladding layer and an n-type distribution Bragg reflector (DBR) layer on the lower side, and a p-type aluminum gallium arsenic (AlGaAs) cladding layer and a p-type DBR layer on the upper side. For the purpose of obtaining a current stricture effect, each of light emitting portion 2b and the p-type layer 2c other than the n-type layer 2a in the semiconductor layer 2 is shaped into a columnar mesa structure. A laser beam is emitted downward through the optically-transparent n-type GaAs layer 2a. A planar shape of the n-type layer 2a, for example, is a square in which a length of one side is 46 μm. A planar shape of the n-side electrode 1 is identical in outer shape to that of the n-type layer 2a, and has a shape in which a hole is provided in the inside. An inner diameter of the hole is slightly larger than an outer diameter of the mesa portion in order to ensure the insulating property for the mesa portion, and, for example, is about 40 μm.

A lower surface of the photoelectric element 6 is formed as either a light emission surface or a light incidence surface. The lower surface of the photoelectric element 6 is joined to an element mounting base 32 by an adhesive agent layer 33. A main portion 36 of an element mounting substrate is provided with lens portions 34. When the photoelectric element 6 is formed as a light emitting element, the lens portion 34 serves to collimate an emitted light from the light emitting element, thereby preventing the spreading of the emitted light. On the other hand, when the photoelectric element 6 is a light receiving element, the lens portion 34 serves to condense an incident light to the light emitting element on the light receiving element (refer to FIGS. 7A to 7C). A diameter of the lens portion 34, for example, is 180 μm, and a central position of the lens portion 34 is made to agree with an element mounting position, therefore, a central position of the base 32. In addition, it is better that a protective wall 35 for protecting the lens portions 34 is provided in the periphery of the lens portions 34. A thickness of the protective wall 35 is set as being slightly larger than that of the lens portion 34, for example, set at 50 μm. As a result, the possibility that any of the lens portions 34 is damaged by unintentional contact is reduced, and thus the main portion 36 of the element mounting substrate is readily handled. In addition, a convex portion for alignment with a waveguide may also be provided similarly to the case of Patent Document 2.

Next, an element disposition substrate according to another embodiment of the present invention will be described hereinafter with reference to FIGS. 2A and 2B.

Figure 2A:
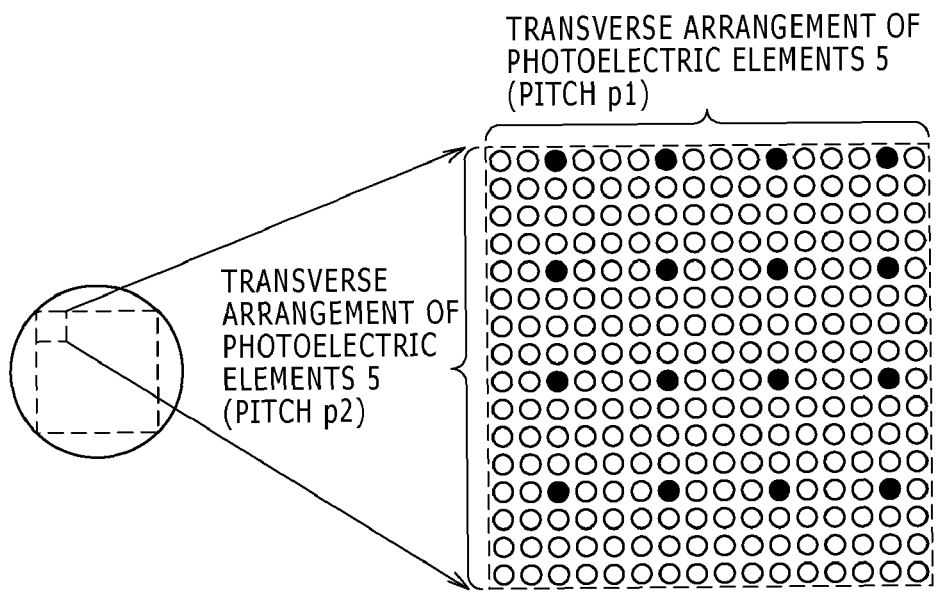
FIGS. 2A and 2B are respectively a top plan view of an element formation substrate in a process for manufacturing the photoelectric converter according to the embodiment of the present invention shown in FIGS. 1A to 1C, and a top plan view of an element disposition substrate in the process for manufacturing the photoelectric converter according to the embodiment of the present invention shown in FIGS. 1A to 1C.
Figure 2B:
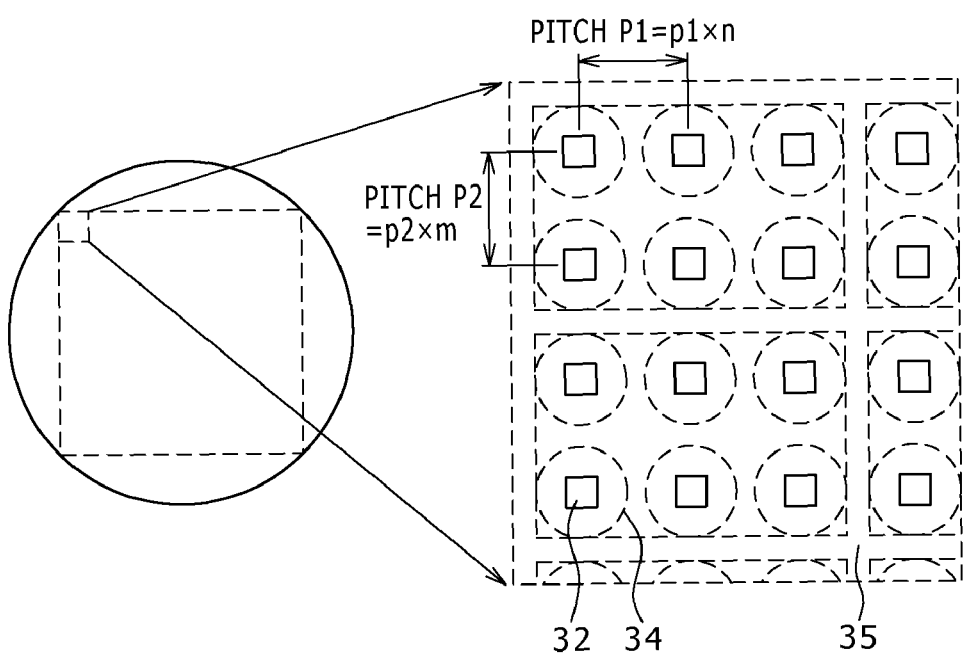

FIGS. 2A and 2B are respectively a top plan view of an element formation substrate such as a three-inch GaAs substrate in a process for manufacturing a photoelectric converter, and a top plan view of an element disposition substrate such as a six-inch glass substrate in the process for manufacturing the photoelectric converter. The element disposition substrate of this embodiment includes, when a plurality of photoelectric elements 6 are made at a transverse (first) pitch on an element formation substrate 11: a substrate main portion 31; and a plurality of element mounting bases 32 each having a planer shape having a size smaller than the first pitch, and each having a bearing surface slightly higher than a surface of the substrate main portion 31 in its periphery formed at a longitudinal (second) pitch which is n times (n=4) as large as the transverse pitch on the surface of the substrate main portion. The element formation substrate 11, the substrate main portion 31, and the element mounting bases 32 are shown in FIGS. 3A to 3V which will be described later.

In addition, hereinafter, a method of manufacturing the photoelectric converter 10 according to still another embodiment of the present invention will be described with reference to FIGS. 3A to 3V by mainly giving the case where a Vertical Cavity Surface Emitting Laser (VCSEL) element for emitting a red light as the photoelectric element is manufactured as an example while suitably referring to FIGS. 2A and 2B. FIGS. 3A to 3V are respectively partial cross sectional views showing a flow of processes for manufacturing the photoelectric converter 10 except that FIGS. 3H, 3L, 3N, 3P, 3R, 3T, and 3V are respectively top plan views. In addition, a description about the photoelectric converter 10 will be supplemented in conjunction with this description about the manufacturing processes.

Figure 3A:
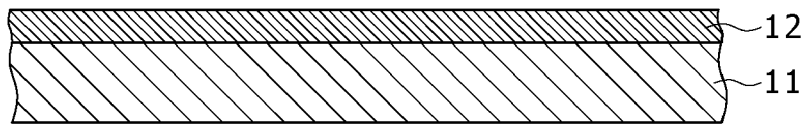
FIGS. 3A to 3F are respectively cross sectional views showing a flow of processes for manufacturing the photoelectric converter according to the embodiment of the present invention.

Firstly, as shown in FIG. 3A, an etching stopper layer (not shown) and a semiconductor material layer 12 which will become a photoelectric conversion portion or the like of the photoelectric element 5 in the later processing are formed on the element formation substrate 11. For example, when the VCSEL element for emitting the red light is manufactured as the photoelectric element 5, a gallium arsenic (GaAs) substrate having a diameter of 2 to 4 inches and a thickness of 500 μm, or the like is used as the element formation substrate 11. In this case, after the etching stopper layer having a thickness of 0.5 μm, an n-type GaAs layer, an n-type DBR layer, an n-type AlGaAs cladding layer, a GaAs light emitting layer, a p-type AlGaAs cladding layer, a p-type DBR layer, and a p-type GaAs layer are laminated in order, thereby forming the semiconductor material layer 12.

Figure 3B:
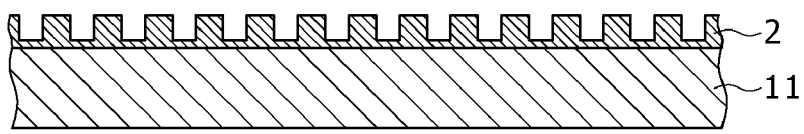

Next, as shown in FIG. 3B, the n-type DBR layer, the n-type AlGaAs cladding layer, the GaAs light emitting layer, the p-type AlGaAs cladding layer, the p-type DBR layer, and the p-type GaAs layer other than the n-type GaAs layer 2a in the semiconductor material layer 12 are shaped into a mesa structure by utilizing a photolithography technique and an etching method, thereby forming the semiconductor layer 2 of each of photoelectric elements 5. At this time, as shown in FIG. 2A as well, any of gaps other than spaces of isolation is removed and thus the photoelectric elements 5 are formed as densely as possible. For example, a transverse pitch p1 and a longitudinal pitch p2 between each adjacent two photoelectric elements 5 are each set at 50 μm, and an outer diameter of each of the mesa portion is set at a little less than about 40 μm.

Figure 3C:
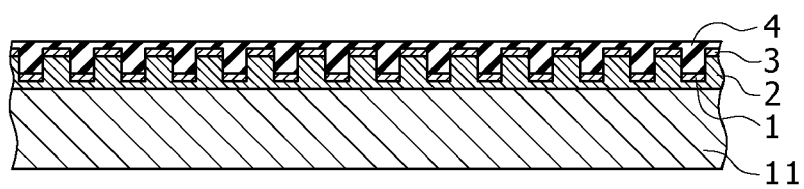

Next, as shown in FIG. 3C, after an electrode material layer is formed over the entire surface by utilizing either a vacuum evaporation method or a sputtering method, the electrode material layer is patterned by utilizing a photolithography technique, an etching method and the like, thereby forming the n-side electrodes 1 and the p-side electrodes 3. After that, the insulating layer 4 made of polyimide or the like is formed so as to be filled in a recess portion between each adjacent two photoelectric elements 5 and so as to thinly cover an upper portion of each of the p-side electrodes 3.

Figure 3D:
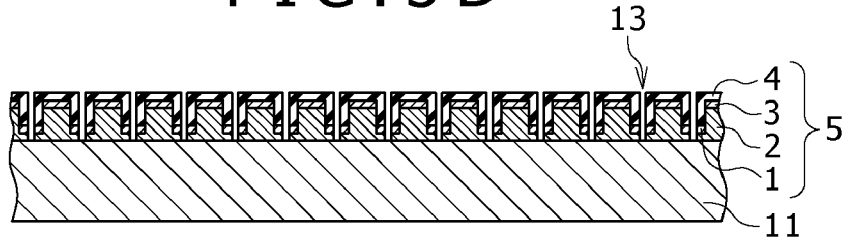

Next, as shown in FIG. 3D, a trench 13 for separating the n-side electrode 1 and the n-type GaAs layer 2a of each of the photoelectric elements 5 from each other is formed by utilizing the photolithography technique, an etching method and the like, thereby forming each of the photoelectric elements 5 each composed of the n-side electrode 1, the semiconductor layer 2, the p-side electrode 3, and the insulating layer 4. At this time, for example, a width of each of the separation trenches 13 is set at 4 μm, and the separation trenches 13 are formed in a lattice in which the longitudinal separation trenches and the transverse separation trenches perpendicularly intersect with each other. As a result, when each of the transverse pitch p1 and the longitudinal pitch p2 between each adjacent two photoelectric elements 5 is set at 50 μm, a planar shape of the n-type layer 2a becomes a square of 46 μm×46 μm.

Figure 3E:
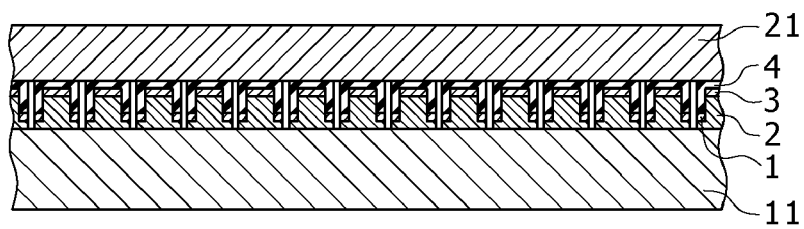
Figure 3F:
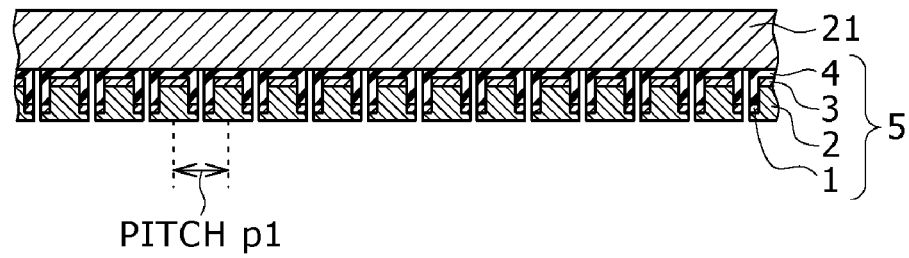

Next, as shown in FIG. 3E, a temporary holding substrate 21 having a low-adhesive agent layer (not shown) provided on its surface is stuck to an upper portion of the insulation layer 4. The temporary holding substrate 21, for example, is a quartz substrate having a thickness of 500 μm. Also, the low-adhesive agent layer is a silicon resin or the like, and is disposed on the upper portion of the insulation layer 4 by utilizing an application method such as a spin coat method.

Figure 4:
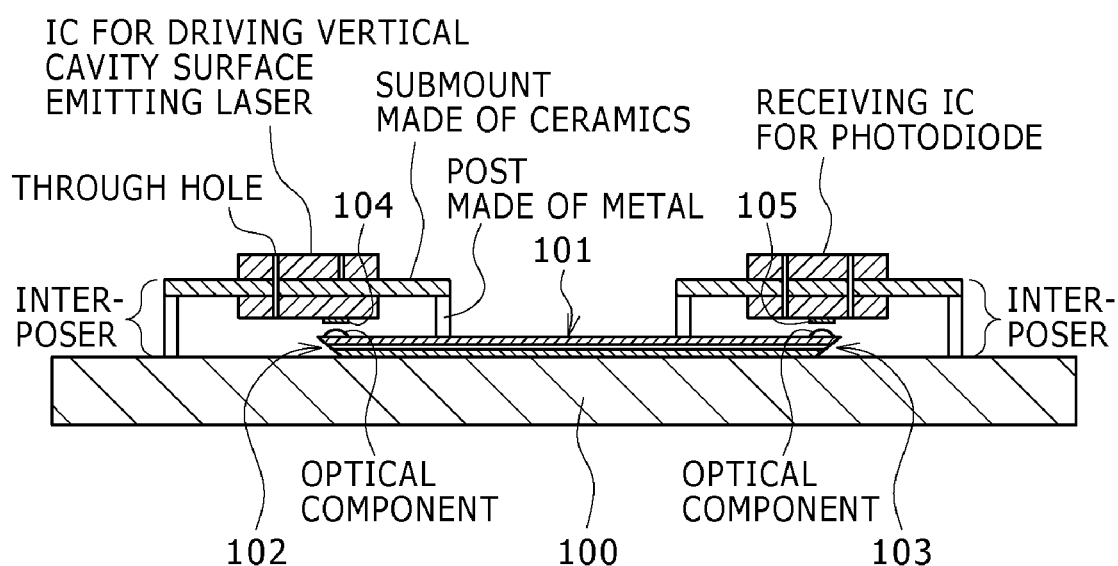
FIG. 4 is a cross sectional view showing an example of an optical signal transmitting device using optical wirings according to the existing art.
Figure 5A:
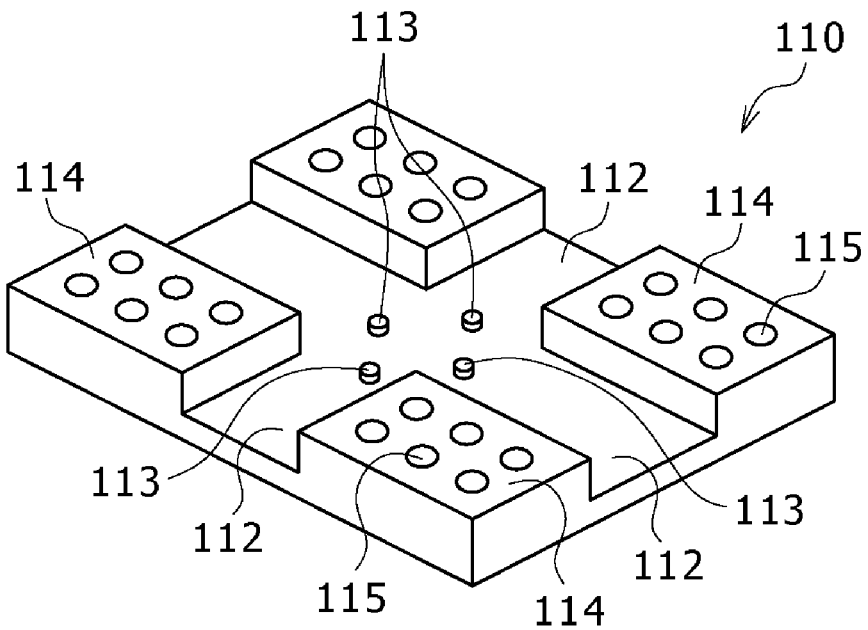
FIGS. 5A and 5B are respectively a schematic perspective view when viewing a socket proposed in Patent Document 2 from a side of a surface on which an optical waveguide is to be installed, and a schematic perspective view when viewing the socket shown in FIG. 5A from a side opposite to the side of the surface on which the optical waveguide is to be installed.
Figure 5B:
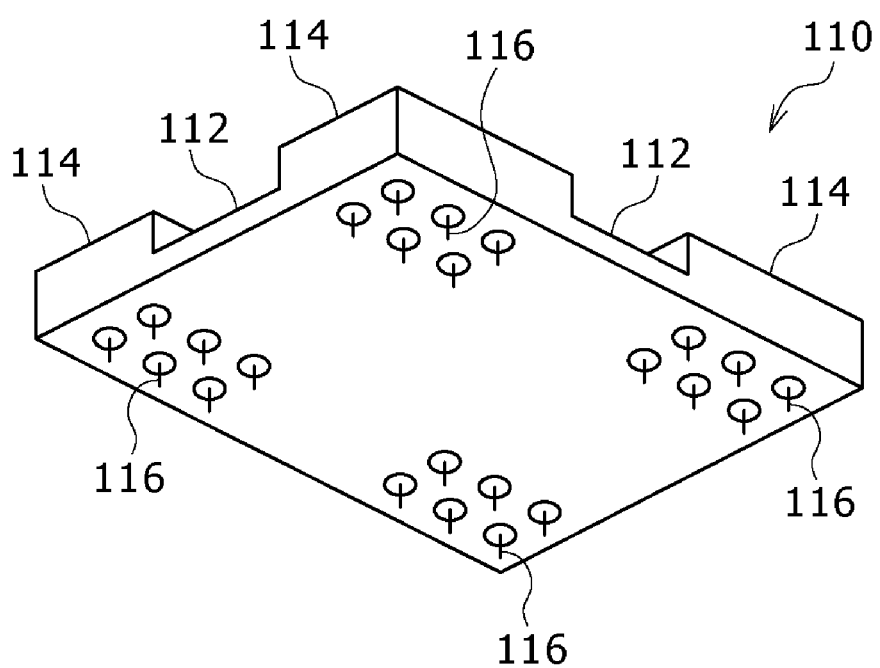

Next, as shown in FIG. 4F, a back surface side (a light incidence/emission side of each of the photoelectric elements 5) of the element formation substrate 11 is removed by utilizing an etching method to be thinned. In this connection, as previously stated, since the etching stopper layer is provided on the lower portion of each of the semiconductor layers 2, the etching is automatically stopped at the etching stopper layer. A height of the photoelectric element 5, for example, is set at 4 μm in the case of the VCSEL element. The photoelectric elements 5 are collectively partitioned into the pieces while being held on the temporary holding substrate 21 by the etching for the element formation substrate 11. A transverse pitch and a longitudinal pitch between each adjacent two photoelectric elements 5 on the temporary holding substrate 21 are identical to the transverse pitch p1 and the longitudinal pitch p2 between each adjacent two photoelectric elements 5 on the element formation substrate 11, respectively.

Figure 3G:
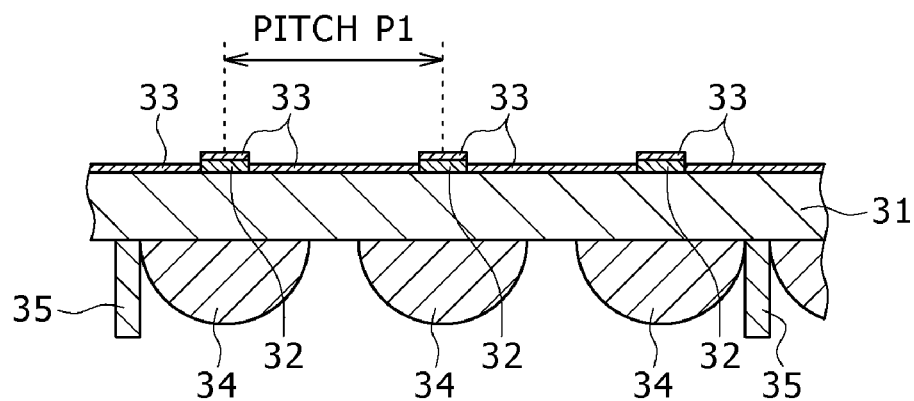
FIGS. 3G and 3H are respectively a cross sectional view, showing the flow of a process for manufacturing the photoelectric converter according to the embodiment of the present invention, taken on line 3H-3H of FIG. 3H, and a top plan view showing the flow of a process for manufacturing the photoelectric converter according to the embodiment of the present invention.
Figure 3H:
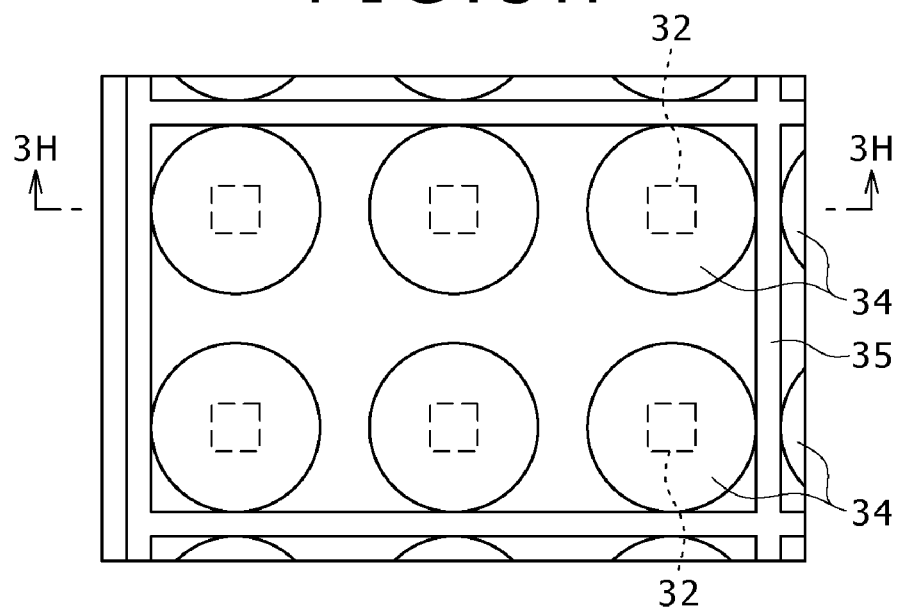

On the other hand, as shown in FIGS. 2B and 3G, the main portion 31 of the element disposition substrate is prepared separately from these members. A glass substrate or the like, for example, having a diameter of six inches and a thickness of 500 μm is used as the main portion 31 of the element disposition substrate. A top plan view shown in FIG. 3H is a top plan view, on a back surface side, of an area surrounded by a dotted line in the enlarged view of FIG. 2B. Also, a cross sectional view shown in FIG. 3G is a cross sectional view taken on line 3H-3H of FIG. 3H.

With regard to the feature of the present invention, the element mounting base 32 is disposed in an element mounting position on the surface of the main portion 31 of the element disposition substrate. It is necessary for a planar shape of the base 32 to have a size smaller than the pitch between each adjacent two photoelectric elements 5 in the temporary holding substrate 21, in other words, the pitch p1 (or p2) between each adjacent two photoelectric elements 5 in the element formation substrate 11. In addition, it is necessary for a bearing surface of the base 32 to be slightly higher than the surface of the main portion 31 of the element disposition substrate in the periphery of the base 32, that is, at least higher than a thickness of the adhesive agent layer 33 which will be formed later. The too high base becomes an obstacle for other processes in some cases. For this reason, it is better that the thickness of the base 32 is made slightly larger than that of the adhesive agent layer 33. In addition, it is necessary that a transverse pitch P1 and a longitudinal pitch P2 between each adjacent two bases 32 are precisely equal to integral multiples of the transverse pitch p1 and the longitudinal pitch p2 between each adjacent photoelectric elements 5, respectively (refer to FIG. 2B). In general, those are only the conditions that the base 32 should meet.

However, when as with this embodiment, the element mounted is the photoelectric element, and thus the incidence or emission of the light is carried out through the base 32, the base 32 has to be optically transparent for the light made incident or emitted. In addition, since each of the elements is solder-mounted, the base 32 has to have a heat-resisting property resistant to a high temperature (in the range of about 160 to about 250° C.) of about a melting point of the solder. When other satisfactory electrical conductivity and thermal conductivity are required for the base 32, a material suitable for the electrical conductivity and the thermal conductivity is suitably selected as the material of the base 32. A method of forming the element mounting base 32 is especially by no means limited.

In this embodiment, when the main portion 31 of the element disposition substrate is composed of a glass substrate, the base 32 can be formed as the base fulfilling both the optical transparency and thermal resistance described above by etching a surface of the glass substrate. In addition, when the main portion 31 of the element disposition substrate is composed of an optically-transparent resin substrate, the element disposition substrate having the bases 32 formed thereon can be made in an injection molding process. In addition, after a layer made of an ultraviolet curable resin, for example, VPA series (product name of an acrylic system resin made by Nippon Steel Chemical Co., Ltd.) is formed on the surface of the main portion 31 of the element disposition substrate, this layer is patterned by utilizing the photolithography technique, thereby making it possible to form the bases 32. In addition, after a resin layer made of polyimide, Spin-On-Glass (SOG) or the like is formed on the surface of the main portion 31 of the element disposition substrate, this layer is patterned by utilizing the photolithography technique and an etching method, thereby making it possible to form the bases 32.

Next, an adhesive agent layer 33 is disposed on the entire surface of the bases 32 and the main portion 31 of the element disposition substrate by utilizing an application method such as a spin coat method. The ultraviolet curable resin which can be simply cured with excellent morphological stability by radiation of the ultraviolet light is preferably used as the material of the adhesive agent layer 33. However, a thermosetting resin can also be used as the material of the adhesive agent layer 33 as long as the morphological stability can be ensured. In general, this is only the condition that the adhesive agent layer 33 should meet. However, in this embodiment, the optical transparency, and the heat-resisting property resistant to the temperature of about the melting point of solder are both necessary for the material of the adhesive agent layer 33.

The lens portions 34 each serving to efficiently carry out the incidence or emission of the light are provided on the back surface side of the main portion 31 of the element disposition substrate. In addition, it is better that a protective wall 35 for protecting the lens portions 34 is provided in the periphery of the lens portions 34. The lens portions 34, the protective wall 35 and the convex portions can be precisely formed in high yields by application of the wafer-level semiconductor manufacturing process. More specifically, there is applied a three-dimensional shape forming method or the like utilizing a three-dimensional exposure technique using a gray mask.

Figure 3I:
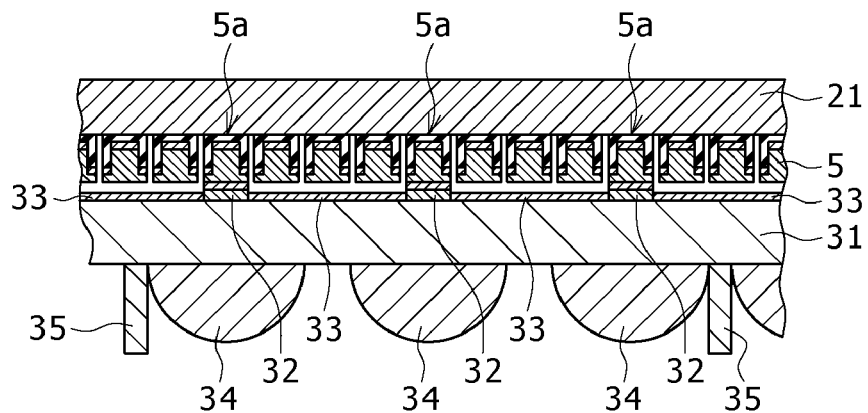
FIGS. 3I to 3K are respectively cross sectional views showing the flow of processes for manufacturing the photoelectric converter according to the embodiment of the present invention.

Next, as shown in FIG. 3I, the photoelectric elements 5 held on the temporary holding substrate 21 are pressed against the upper portion of the main portion 31 of the element disposition in a state in which the adhesive agent layer 33 is uncured. At this time, each of the bearing surfaces of the bases 32 is slightly higher than the surface of the upper portion of the main portion 31 of the element disposition substrate in the periphery of each of the bearing surfaces of the bases 32. As a result, photoelectric elements 5a corresponding to the element mounting positions, respectively, of the photoelectric elements 5 held on the temporary holding substrate 21 come in contact with the adhesive agent layer 33 disposed on each of the bases 32. In this connection, since the thickness of each of the bases 32 is larger than that of the adhesive agent layer 33, none of the photoelectric elements other than the photoelectric elements 5a comes in contact with the adhesive agent layer 33 disposed on the main portion 31 of the element disposition substrate in the periphery of the bases 32.

Next, the adhesive agent layer 33 is cured, thereby fixing the photoelectric elements 5a to the respective bases 32. When the adhesive agent layer 33 is made of the ultraviolet curable resin, an ultraviolet light is radiated from the back surface side of the main portion 31 of the element disposition substrate to the adhesive agent layer 33, thereby curing the adhesive agent layer 33. For example, an I-line is radiated to the adhesive agent layer 33 for 60 seconds. When the ultraviolet curable resin is used as the material of the adhesive agent layer 33, the ultraviolet curable resin can be cured at a room temperature. Thus, in this case, there is an advantage that displacement owing to a temperature change does not occur.

Figure 3J:
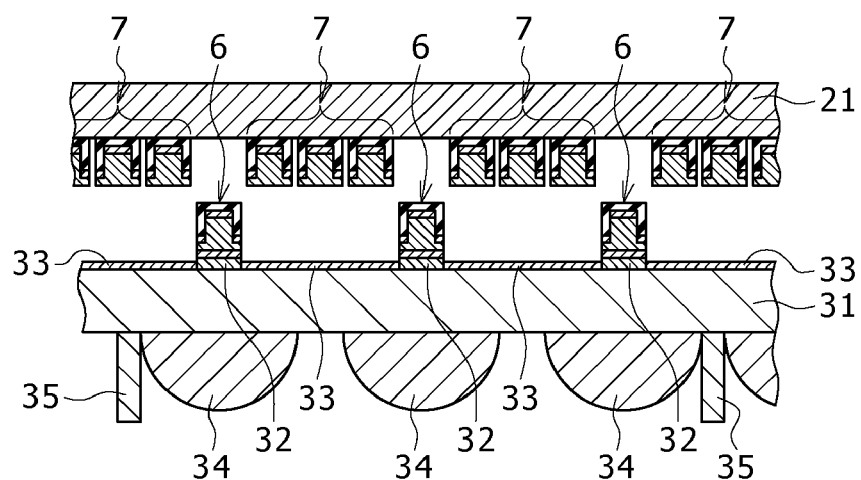

Next, as shown in FIG. 3J, the temporary holding substrate 21 and the main portion 31 of the element disposition substrate are quietly separated from each other. As a result, the photoelectric elements 5a each contacting the adhesive agent layer 33 on the respective bases 32 are left on the respective bases 32 to be selectively transferred from the temporary holding substrate 21 to the main portion 31 of the element disposition substrate (the photoelectric element 6). On the other hand, other photoelectric elements 5 each not contacting the adhesive agent layer 33 are kept held on the temporary holding substrate 21 (the photoelectric elements 7). The photoelectric elements 7 each not transferred wait for the transfer in the transfer process in and after the next time.

As can be seen from FIGS. 3I and 3J, the condition under which the transfer described above is reliably carried out is described as follows. That is to say, with regard to the transverse direction, the transverse pitch P1 between each adjacent two bases 32 is exactly n times (n is a positive integral number) as large as the transverse pitch between each adjacent two photoelectric elements 5 in the temporary holding substrate 21, in other words, the transverse pitch p1 between each adjacent two photoelectric elements 5 in the element formation substrate 11. At this time, the photoelectric elements 5 each selected every (n−1) photoelectric elements 5 of the photoelectric elements 5 arranged in a line in the transverse direction on the temporary holding substrate 21 is collectively transferred to the respective bases 32 on the main portion 31 of the element disposition substrate. The case shown in FIGS. 3I and 3J is the case of n=4. Thus, the photoelectric elements 5 each selected every three photoelectric elements 5 of the photoelectric elements 5 arranged in a line in the transverse direction in FIG. 3I is collectively transferred to the respective bases 32 on the main portion 31 of the element disposition substrate.

Although the transfer in the transverse direction is as described above, with regard to the longitudinal direction as well, the same transfer is carried out because the photoelectric elements 5 form the two-dimensional disposition on the element formation substrate 11 as shown in FIG. 2A. That is to say, when the longitudinal pitch P2 between each adjacent two bases 32 in the main portion 31 of the element disposition substrate is exactly m times (m is a positive integral number) as large as the longitudinal pitch p2 between each adjacent two photoelectric elements 5 in the element formation substrate 11, the photoelectric elements 5 each selected every (m−1) photoelectric elements 5 of the photoelectric elements 5 arranged in a line in the longitudinal direction on the element formation substrate 11 is collectively transferred to the respective bases 32 on the main portion 31 of the element disposition substrate. The case shown in FIG. 2B is the case of m=4. Thus, the photoelectric elements 5 each selected every three photoelectric elements 5 of the photoelectric elements 5 arranged in a line in the longitudinal direction in FIG. 2B is collectively transferred to the respective bases 32 on the main portion 31 of the element disposition substrate.

In summary, the photoelectric elements 5, on the element formation substrate 11, indicated in FIG. 2A by black circles are collectively transferred to the respective bases 32 of the main portion 31 the element disposition substrate shown in FIG. 2B in one transfer process. For example, when the diameter of the element disposition substrate is six inches which is two times as large as that of the element formation substrate 11, the transfer of the photoelectric elements 5, the transfer of the photoelectric elements 5 to one sheet of main portion 31 of the element disposition substrate is completed by repetitively carrying out the transfer process by four times while the positions are shifted. Since the transverse direction and the longitudinal direction are independent of each other, it is unnecessary that p1=p2 or n=m. In general, p1≠p2, n≠m, and P1≠P2 may be established. In addition, it is unnecessary to necessarily carry out the two-dimensional transfer by one transfer process. Thus, the adhesive agent layer 33 is disposed only on each of the specific bases 32 by utilizing a printing method or the like, whereby the photoelectric elements 5 can also be transferred onto only the specific bases 32, respectively. The method of selectively disposing the adhesive agent layer 33 only on the neighborhoods of the specific bases 32 is more advantageous than the method of selectively sticking the adhesive agent to each of the specific photoelectric elements to be transferred because it does not require the precision.

The thickness of the adhesive agent layer 33 is advantageous for the selective transfer based on the present invention as thickness of the adhesive agent layer 33 becomes thinner. For example, it is ideal that the photoelectric elements 6 can be stably fixed to the respective bases 32 by the adhesive agent layer 33 having a thickness of about 0.5 μm. In this case, for the purpose of preventing any of the photoelectric elements other than the photoelectric elements 5a from coming in contact with the adhesive agent layer 33 disposed on the main portion 31 of the element disposition substrate in the periphery of the bases 32, even when the dispersion of the thicknesses of the adhesive agent layers 33 or the like is taken into consideration, all that is required is that a height (thickness) of about 1 to about 2 μm is obtained as the height (thickness) of each of the bases 32. However, the adhesive force is insufficient in some cases unless the thickness of the adhesive agent layer 33 is increased a little more. For example, when the adhesive agent layer 33 having the thickness of about 5 μm is necessary for stably fixing the photoelectric elements 6 to the adhesive agent layer 33, for the purpose of preventing any of the photoelectric elements other than the photoelectric elements 5a from coming in contact with the adhesive agent layer 33, when the dispersion of the thicknesses of the adhesive agent layers 33 or the like is taken into consideration, a height (thickness) of about 8 to about 15 μm is necessary as the height (thickness) of each of the bases 32, "slightly" contained in the wording "slightly higher than a surface of a main portion of a substrate" according to an embodiment of the present invention contains the purport as well that "be preferably suitably changed in accordance with the thickness of the adhesive agent layer 33."

It is better that the planar shape of each of the bases 32 is ideally identical to that of each of the photoelectric elements 5 to be mounted. For stably holding the photoelectric elements 5, it is necessary for each of the bases 32 to have the planar shape equal to or larger than that of each of the photoelectric elements 5. On the other hand, when the planar shape of each of the bases 32 is too large, the adhesive agent layer 33 on each of the bases 32 comes in contact with each of the photoelectric elements 5 not intended to be transferred, so that the disorder is caused in the transfer. An allowable error for the position and/or the shape of the base 32 depends on a width of a separation trench 13 between each adjacent two photoelectric elements 5 on the element formation substrate 11. When the width of the separation trench 13 is about 4 μm, the allowable error for the position and/or the shape of the base 32 is about ±2 μm.

However, in the case where the thickness of the adhesive agent layer 33 is large, when an amount of adhesive agent forced out due to the pressing of the adhesive agent is taken into consideration, it is better in some cases that the planar shape of each of the bases 32 is made smaller than that of each of the photoelectric elements 5. For example, when the thickness of the adhesive agent layer 33 is about 5 µm, it is better in some cases that the planar shape of each of the bases 32 is made smaller about 5 to about 15 µm than that of each of the photoelectric elements 5.

The case described above is the case where the process for separating the temporary holding substrate 21 and the element disposition substrate from each other is carried out after the process for curing the uncured adhesive agent layer 33 is carried out. It is preferable to carry out these processes. The reason for this is because the photoelectric elements 5a are reliably transferred to the element disposition substrate since the separating process is carried out after the photoelectric elements 5a on the temporary holding substrate 21 are fixed to the respective bases 32. However, when this can not be carried out due to some sort of circumstances, it is also possible to carry out a process in which a material having a low-adhesive property is used as the material of the adhesive agent layer 33, and the adhesive agent layer 33 is cured after the process for separating the temporary holding substrate 21 and the element disposition substrate from each other is carried out.

Figure 3K:
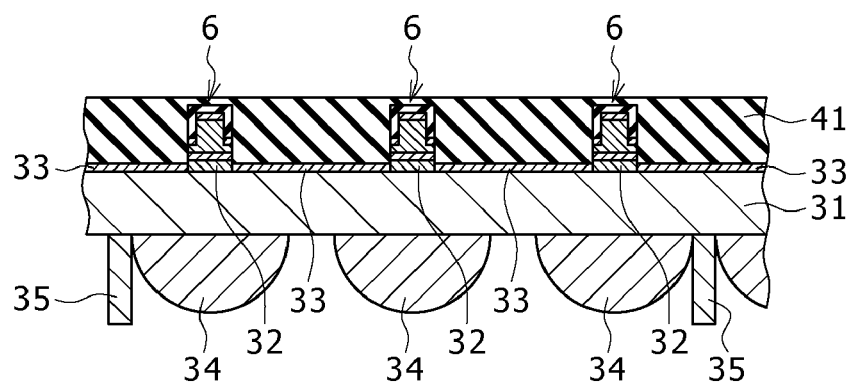

Next, as shown in FIG. 3K, the insulating layer 41, having a thickness of about 5 µm, made of polyimide or the like is formed so as to cover and protect the photoelectric elements 6 thus transferred. Hereinafter, as shown in FIGS. 3L to 3U, wirings and bumps for flip chip-connection are formed in the known processes. It is noted that FIGS. 3M, 3O, 3Q, 3S, and 3U are cross sectional views taken on line 1C-1C of FIG. 1A, and FIGS. 3L, 3N, 3P, 3R, and 3T are top plan views of structures shown in FIGS. 3M, 3O, 3Q, 3S, and 3U, respectively.

Figure 3L:
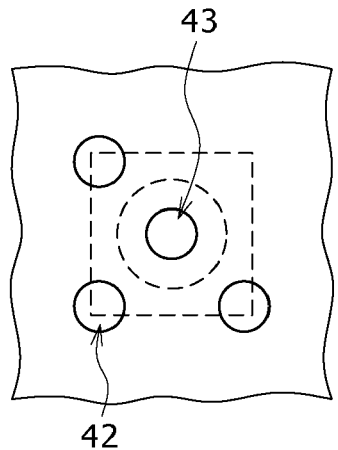
FIGS. 3L and 3M are respectively a top plan view showing the flow of a process for manufacturing the photoelectric converter according to the embodiment of the present invention, and a cross sectional view taken on line 3L-3L of FIG. 3L.
Figure 3M:
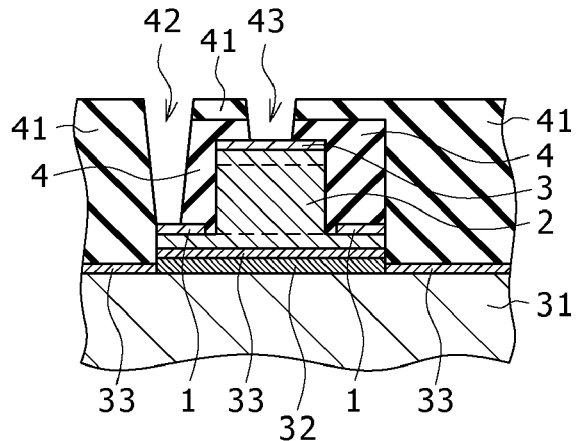

Firstly, as shown in FIGS. 3L and 3M, via holes 42 and 43 each having a pore diameter of about 10 µm for connection to the n-side electrode 1 and the p-side electrode 3 are formed in the insulating layer 41 and the insulating layer 4 by carrying out laser processing. The reason that three via holes 42 are formed is because one of the three via holes 42 is necessarily caused to conduct even when the position shift is caused, thereby reducing the imperfect conduction.

Figure 3N:
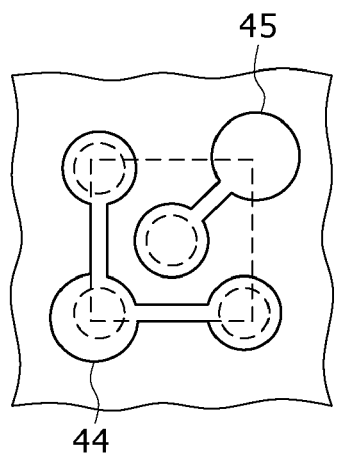
FIGS. 3N and 3O are respectively a top plan view showing the flow of a process for manufacturing the photoelectric converter according to the embodiment of the present invention, and a cross sectional view.
Figure 3O:
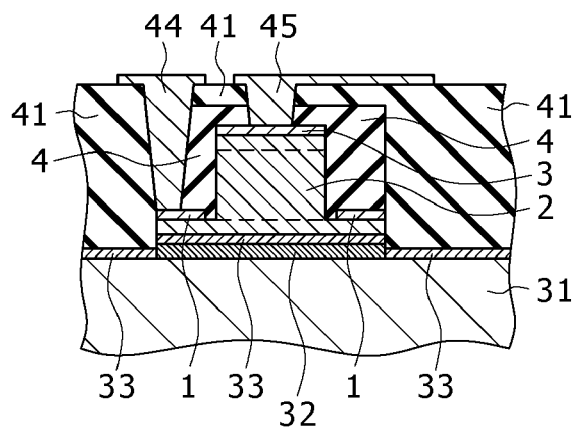

Next, as shown in FIGS. 3N and 3O, a titanium (Ti) layer having a thickness of 50 nm, and a copper (Cu) layer having a thickness of 1,000 nm are laminated in order by utilizing the sputtering method or the like, thereby forming the wirings 44 and 45.

Figure 3P:
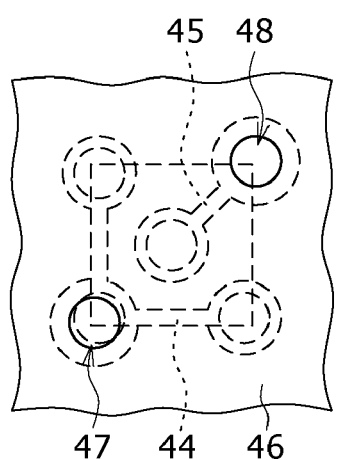
FIGS. 3P and 3Q are respectively a top plan view showing the flow of a process for manufacturing the photoelectric converter according to the embodiment of the present invention, and a cross sectional view.
Figure 3Q:
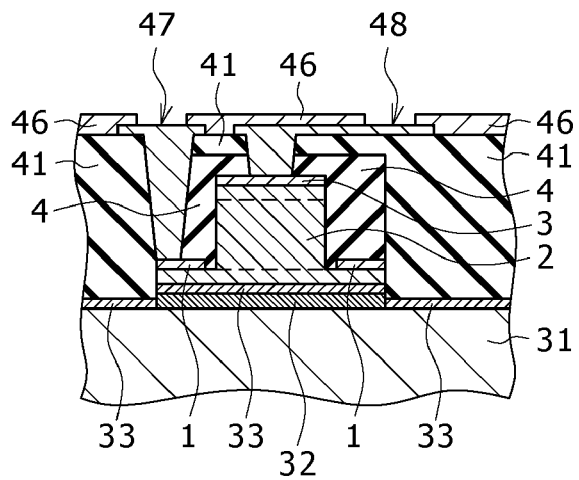

Next, as shown in FIGS. 3P and 3Q, a passivation layer 46, having a thickness of about 2 µm, made of polyimide or the like is formed so as to cover the wirings 44 and 45. After that, opening portions each having a diameter of about 60 µm are formed in extraction portions for the wirings 44 and 45, thereby forming electrode pads 47 and 48, respectively.

Figure 3R:
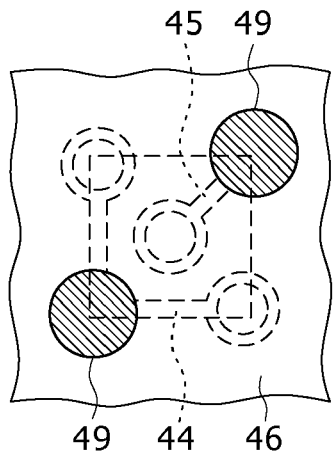
FIGS. 3R and 3S are respectively a top plan view showing the flow of a process for manufacturing the photoelectric converter according to the embodiment of the present invention, and a cross sectional view.
Figure 3S:
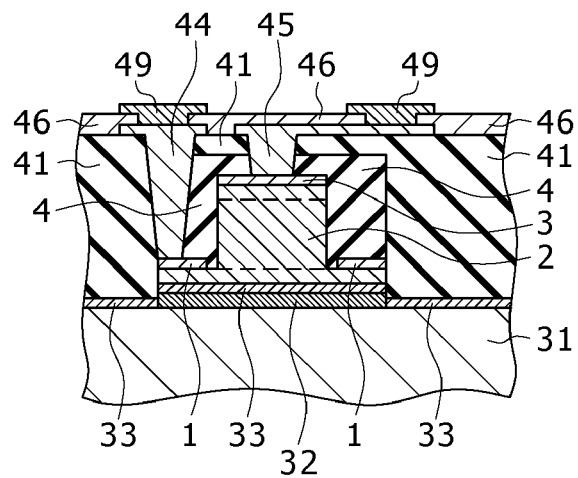

Next, as shown in FIGS. 3R and 3S, an Under Bump Metal (UBM) layer 49 having a diameter of 80 µm is formed on each of electrode pads 47 and 48 by utilizing a non-electrolytic plating method. For example, a gold (Au) layer having a thickness of 50 nm, and a nickel (Ni) layer having a thickness of 5 µm are laminated in order, thereby forming the UBM layer 49.

Figure 3T:
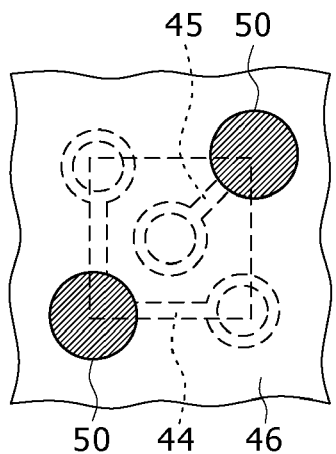
FIGS. 3T and 3U are respectively a top plan view showing the flow of a process for manufacturing the photoelectric converter according to the embodiment of the present invention, and a cross sectional view.
Figure 3U:
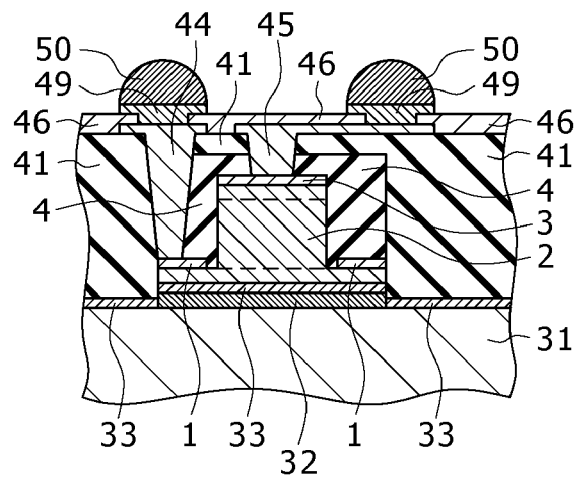
Figure 3V:
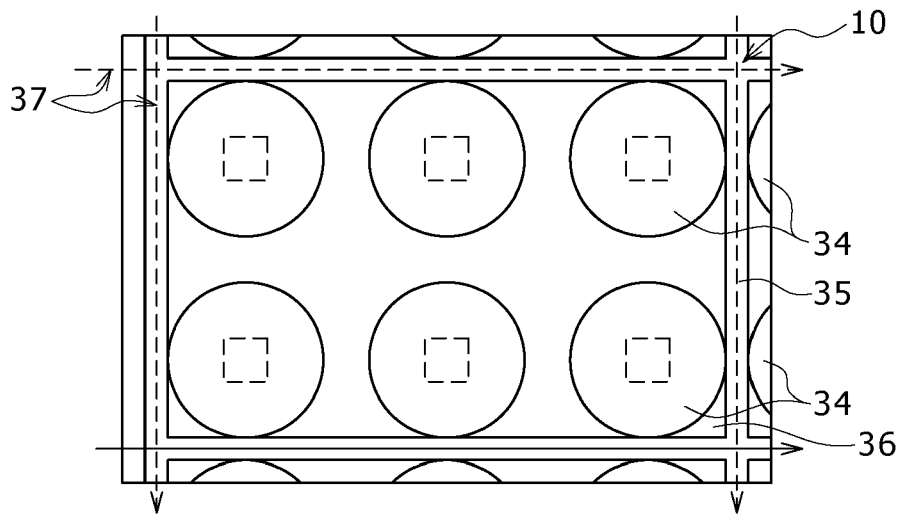
FIG. 3V is a top plan view showing the flow of a process for manufacturing the photoelectric converter according to the embodiment of the present invention.

Next, as shown in FIGS. 3T and 3U, solder bumps 50 each having a diameter of 80 µm are formed. In this case, a general Sn/Ag/Cu alloy, for example, is used as a material of each of the solder bumps 50, and a solder paste is disposed by utilizing a screen printing method.

Next, as shown in FIG. 3V, the main portion 31 of the element disposition substrate is cut along a scribe line 37 passing through a center of the protective wall 35, thereby obtaining the main portion 36 of the element mounting substrate. The various kinds of members either formed or mounted to the main portion 36 of the element mounting substrate serve as one functional unit, thereby composing the photoelectric converter 10.

In addition, a method of transferring elements according to yet another embodiment of the present invention includes the steps of: holding the plurality of photoelectric elements 6 made at the transverse (first) pitch p1 on the element formation substrate 11 on the temporary holding substrate 21 in the state in which the transverse pitch p1 is held although the plurality of photoelectric elements 6 are partitioned into pieces; forming the plurality of element mounting bases 32 each having the planar shape having the size smaller than the transverse pitch p1, and each having the bearing surface slightly higher than the surface of the main portion 31 of the element disposition substrate in its periphery at the longitudinal (second) pitch p2 which is n times (n=4) as large as the transverse pitch p1 on the surface of the main portion 31 of the element disposition substrate, thereby obtaining the element disposition substrate; disposing the uncured adhesive agent layer 33 on each of the bearing surfaces of the element mounting bases 32; making the temporary holding substrate 21 and the element disposition substrate close to each other in the state in which the principal surfaces of the temporary holding substrate 21 and the element disposition substrate face each other, and causing the photoelectric elements 5a of the plurality of photoelectric elements 5 to come in contact with the uncured adhesive agent layer 33; curing the uncured adhesive agent layer 33, thereby fixing the partial elements 5a contacting the adhesive agent layer 33 to the element mounting bases 32, respectively; and separating the temporary holding substrate 21 and the element disposition substrate from each other with the elements 5a contacting the adhesive agent layer 33 being left on the respective element mounting bases 32.

Although the present invention has been described so far based on the embodiments, it is to be understood that the present invention is by no means limited thereto, and thus the embodiments can be suitably changed without departing from the gist of the invention.

The photoelectric converter and the optical waveguide members of the present invention are suitably used in an optical wiring system which can be applied to various kinds of portions such as a portion between electronic apparatuses, and a portion between boards within the electronic apparatus, especially, a portion between semiconductor chips within the board. Thus, the photoelectric converter and the optical waveguide members of the present invention can contribute to constitution of a high-speed, high-density, and low-cost optical transmission/optical communication system.

The present invention contains subject matter related to Japanese Patent Application JP 2008-315382 filed in the Japanese Patent Office on Dec. 11, 2008, the entire contents of which being incorporated herein by reference.

What is claimed is:

1. A method of transferring elements, comprising the steps of:
holding a plurality of elements made at a first pitch on an element formation substrate on a temporary holding substrate in a state in which the first pitch is held although said plurality of elements are partitioned into pieces;
forming a plurality of element mounting bases, each having a planar shape having a size smaller than the first pitch, and each having a bearing surface slightly higher than a surface of a main portion of an element disposition substrate in a periphery of the element mounting base at a second pitch equal to an integral multiple of the first pitch on the surface of said main portion of said element disposition substrate;

disposing an uncured adhesive agent layer on each of said bearing surfaces of said element mounting bases;

making said temporary holding substrate and said element disposition substrate close to each other in a state in which principal surfaces of said temporary holding substrate and said element disposition substrate face each other, and causing some of said plurality of elements to come in contact with said uncured adhesive agent layer;

curing said uncured adhesive agent layer, fixing the elements contacting said adhesive agent layer to the element mounting bases, respectively; and separating said temporary holding substrate and said element disposition substrate from each other with the elements contacting said adhesive agent layer being left on the respective element mounting bases.

2. The method of transferring elements according to claim 1, wherein a base having the same planar shape as that of each of said elements is formed as each of said element mounting bases.

3. The method of transferring elements according to claim 1, wherein each of said element mounting bases is formed by etching a surface of said element disposition substrate.

4. The method of transferring elements according to claim 1, wherein said element disposition substrate having said element mounting bases is made by injection molding.

5. The method of transferring elements according to claim 1, wherein after an ultraviolet curable resin layer is formed on a surface of said element disposition substrate, each of said element mounting bases is formed by patterning said ultraviolet curable resin layer by utilizing a photolithography technique.

6. The method of transferring elements according to claim 1, wherein after a resin layer is formed on a surface of said element disposition substrate, each of said element mounting bases is formed by patterning said resin layer by utilizing a photolithography technique and an etching method.

7. The method of transferring elements according to claim 1, wherein after the step of curing said uncured adhesive agent layer, the step of separating said temporary holding substrate and said element disposition substrate from each other is carried out.

8. The method of transferring elements according to claim 1, wherein:

a material having a low-adhesive property is used as a material of said uncured adhesive agent layer, and after the step of separating said temporary holding substrate and said element disposition substrate from each other, the step of curing said uncured adhesive agent layer is carried out.

9. The method of transferring elements according to claim 1, wherein:

an ultraviolet curable resin is used as a material of said uncured adhesive agent layer, and the step of curing said uncured adhesive agent layer is carried out by radiation of an ultraviolet light.

10. A method of manufacturing a device, comprising the steps of:

holding a plurality of elements made at a first pitch on an element formation substrate on a temporary holding substrate in a state in which the first pitch is held although said plurality of elements are partitioned into pieces;

forming a plurality of element mounting bases each having a planar shape having a size smaller than the first pitch, and each having a bearing surface slightly higher than a surface of a main portion of an element disposition substrate in a periphery of the element mounting base at a second pitch equal to an integral multiple of the first pitch on the surface of said main portion of said element disposition substrate;

disposing an uncured adhesive agent layer on each of said bearing surfaces of said element mounting bases;

making said temporary holding substrate and said element disposition substrate close to each other in a state in which principal surfaces of said temporary holding substrate and said element disposition substrate face each other, and causing some of said plurality of elements to come in contact with said uncured adhesive agent layer;

curing said uncured adhesive agent layer, fixing the elements contacting said adhesive agent layer to said element mounting bases, respectively;

separating said holding substrate and said element disposition substrate from each other with the elements contacting said adhesive agent layer being left on the respective element mounting bases; and cutting and partitioning said element disposition substrate into pieces each having a predetermined shape, and/or connecting a plurality sheets of element disposition substrates to one another, forming a substrate having the elements each having the predetermined shape through assemble.

11. The method of manufacturing a device according to claim 10, wherein a base having the same planar shape as that of each of said elements is formed as each of said element mounting bases.

12. The method of manufacturing a device according to claim 10, wherein:

semiconductor elements are mounted as said elements, and wirings and/or electrodes for said semiconductor elements are collectively formed before the assemble step.

* * * * *